(12) United States Patent
Yin et al.

(10) Patent No.: US 10,840,389 B2
(45) Date of Patent: Nov. 17, 2020

(54) SOLAR CELLS FOR SHINGLED SOLAR CELL MODULE, SHINGLED SOLAR CELL MODULE, AND METHOD OF MAKING SOLAR CELLS

(71) Applicant: Chengdu Yefan Science and Technology Co., Ltd., Sichuan (CN)

(72) Inventors: Bingwei Yin, Hefei (CN); Jun Sun, Hefei (CN); Zhengrong Zhang, Hefei (CN); Dengyun Chen, Hefei (CN); Shiyin Ding, Hefei (CN); Fushen Zhou, Hefei (CN)

(73) Assignee: CHENGDU YEFAN SCIENCE AND TECHNOLOGY CO., LTD., Sichuan (CN)

(*) Notice: Subject to any disclaimer, the term of this patent is extended or adjusted under 35 U.S.C. 154(b) by 0 days.

(21) Appl. No.: 16/553,118

(22) Filed: Aug. 27, 2019

(65) Prior Publication Data
US 2020/0161481 A1    May 21, 2020

Related U.S. Application Data

(63) Continuation of application No. PCT/CN2018/119519, filed on Dec. 6, 2018.

(30) Foreign Application Priority Data

Nov. 20, 2018  (CN) .......................... 2018 1 1385343

(51) Int. Cl.
*H01L 31/02*    (2006.01)
*H01L 31/05*    (2014.01)
*H01L 31/18*    (2006.01)

(52) U.S. Cl.
CPC .......... *H01L 31/0201* (2013.01); *H01L 31/05* (2013.01); *H01L 31/18* (2013.01)

(58) Field of Classification Search
CPC ...... H01L 31/0201; H01L 31/05; H01L 31/18; H01L 31/022425–022433; H01L 31/0475
See application file for complete search history.

(56) References Cited

U.S. PATENT DOCUMENTS

| 9,935,221 B1 | 4/2018 | Zhou et al. |
| 2014/0262793 A1* | 9/2014 | Babayan ........... H01L 31/02243 205/78 |

(Continued)

FOREIGN PATENT DOCUMENTS

| JP | 2018-152561 A | 9/2018 |
| KR | 10-2013-0034348 A | 4/2013 |

(Continued)

OTHER PUBLICATIONS

IP Australia, Examination Report, AU Patent Application No. 2018409643, dated Sep. 13, 2019, six pages.

(Continued)

*Primary Examiner* — William E McClain
(74) *Attorney, Agent, or Firm* — Fenwick & West LLP

(57) ABSTRACT

The present disclosure relates to solar cells for a shingled solar cell module, a shingled solar cell module, and a method of making solar cells for the shingled solar cell module. Said solar cell has a front side and a back side, a plurality of front side busbars being arranged on the front side, a plurality of back side busbars being arranged on the back side, the solar cell comprising a plurality of sections, each section comprising a front side busbar and a back side busbar located at edges thereof, the front side busbar of at least one section of the solar cell having an extension at one end or both ends, the extension extending along another edge of said at least one section intersecting with the above-mentioned edges. The shingled solar cell module is fabricated from solar cell strips split from the solar cell.

16 Claims, 21 Drawing Sheets

(56) References Cited

U.S. PATENT DOCUMENTS

| | | | |
|---|---|---|---|
| 2015/0349174 A1 | 12/2015 | Morad et al. | |
| 2015/0349703 A1* | 12/2015 | Morad | H01L 31/05 |
| | | | 136/251 |
| 2016/0087137 A1* | 3/2016 | Shibasaki | H01L 25/042 |
| | | | 136/249 |
| 2017/0194516 A1* | 7/2017 | Reddy | H01L 31/02243 |
| 2018/0076761 A1* | 3/2018 | Rehder | H01L 25/042 |
| | | | 136/249 |
| 2018/0261706 A1* | 9/2018 | Zhou | H01L 31/0508 |

FOREIGN PATENT DOCUMENTS

| | | | |
|---|---|---|---|
| WO | WO 2018/161286 A1 | 9/2018 | |
| WO | WO-2018161286 A1 * | 9/2018 | H01L 31/0201 |

OTHER PUBLICATIONS

Korean Intellectual Property Office, Office Action, KR Patent Application No. 10-2019-7015891, dated Jun. 25, 2019, six pages (with concise explanation of relevance).

* cited by examiner

Arranging the back side busbars

Arranging the front side busbars

SOLAR CELLS FOR SHINGLED SOLAR CELL MODULE, SHINGLED SOLAR CELL MODULE, AND METHOD OF MAKING SOLAR CELLS

CROSS REFERENCE TO RELATED APPLICATIONS

This application is a continuation of International Application No. PCT/CN2018/119519, filed on Dec. 6, 2018, which claims priority from Chinese Application No. 201811385343.9 filed on Nov. 20, 2018. The content of the aforementioned applications is hereby incorporated by reference in its entirety.

FIELD

The present disclosure relates to solar cells for a shingled solar cell module, a shingled solar cell module, and a method of making the solar cells for the shingled solar cell module.

BACKGROUND

As conventional fossil energy such as coal, petroleum and natural gas is consumed at a faster speed worldwide, ecological environment is deteriorating, especially the greenhouse gas emissions leads to increasingly severe global climate change, and the sustainable development of human society has been seriously threatened. Countries around the world have developed their own energy development strategies to cope with the limitations of conventional fossil energy resources and the environmental problems brought about by development and utilization. The solar energy has become one of the most important renewable energy sources due to its characteristics such as reliability, safety, extensiveness, longevity, environmental protection and resource adequacy, and is expected to become a main pillar of the global power supply in the future.

Under the background of vigorously promoting and using green solar energy, the shingled solar cell module technology can significantly improve the efficiency of the module. The process of fabricating the shingled solar cell module has certain requirements for the solar cell pattern design. The conventional design of the shingled cells uses the cut solar cell strips to fabricate the shingled solar cell module. Due to the asymmetric solar cell busbar design, the current collecting path is long. In the electroluminescence (EL) image of the shingled solar cell module, the image brightness at both ends at the cell edges is darker than in the middle, which affects the final power output of the module.

In particular, since the conventional monocrystalline silicon wafer for producing the shingled solar cell module has chamfered corners, the shingled solar cell string does not have a sufficient cell-conductive adhesive-cell connection at the corresponding positions. The effective width of the busbar of the solar cell strip at the edge of the solar cell is shorter than that of the middle. As such, when the chamfered strip is used to make the shingled solar cell module, the current collecting path of the chamfered part is long and the resistance is high, which causes the area to be darker than the middle in the EL imaging, affecting the power output of the module.

SUMMARY

An object of the present disclosure is to provide a solar cell for a shingled solar cell module, which can overcome the deficiencies of the prior art.

Said object is achieved by a solar cell for a shingled solar cell module according to the disclosure, said solar cell having a front side and a back side, a plurality of front side busbars being arranged on the front side, a plurality of back side busbars being arranged on the back side, the solar cell comprising a plurality of sections, each section comprising a front side busbar and a back side busbar located at edges thereof, the front side busbar and/or back side busbar of at least one section of the solar cell having an extension at one end or both ends, the extension extending along another edge of said at least one section intersecting with the edges.

The present disclosure, by extending the front side busbar, increases the current collecting capability of the busbar, thereby improving the efficiency of the shingled solar cell module.

In accordance with a preferred embodiment of the present disclosure, the solar cell has chamfered corners, and an extension of the front side busbar and/or back side busbar of at least one chamfered section of the solar cell having a chamfer extends along another edge of the chamfered section intersecting with the edges of the section where the front side busbar and/or back side busbar locates. For example, when the front side busbar and/or back side busbar are along a long edge of a chamfer-free side of the chamfered section, after the front side busbar and/or back side busbar reach another edge of the chamfered section orthogonal with the long edge, namely, a short edge of the chamfered section, the front side busbar and/or back side busbar continues to extend along the short edge. Herein, the busbar in the chamfered portion is extended so that the current collecting capacity of the busbar at the chamfered portion is enhanced, thereby improving the EL imaging of the shingled solar cell module and improving the efficiency of the chamfered module.

Preferably, the extension may extend along a partial or entire area of the another edge of the chamfered section.

Further preferably, the extension may extend along an entire area of the another edge of the chamfered section and continue to extend along a partial or entire area of a further edge of the chamfered section that abuts against the another edge. For example, when the front side busbar is along the long edge of the chamfer-free side of the chamfered section, after the front side busbar reaches other edge of the chamfered section perpendicular to the long edge, i.e., a short edge of the chamfered section, the front side busbar continues to extend along the entire area of the short edge and continues to extend along another edge of the chamfered section that abuts against the short edge, i.e., extend along a partial or entire area of the chamfered edge.

According to a preferred embodiment of the disclosure, the extension may extend linearly with a constant width or with a non-constant width.

According to a preferred embodiment of the present disclosure, the plurality of front side busbars are distributed evenly spaced apart on the front side.

According to a preferred embodiment of the present disclosure, the plurality of front side busbars are distributed unevenly spaced apart on the front side.

Preferably, the plurality of front side busbars may include two front side busbars which are adjacent to each other, and the two front side busbars are not close to the edges of the solar cell with respect to other front side busbars.

Preferably, the plurality of front side busbars may include two pairs of front side busbars, and two front side busbars of each pair of the two pairs of front side busbars are adjacent to each other, and the two pairs of front side busbars adjacent to each other are respectively close to one edge of the solar cell.

Preferably, the plurality of front side busbars may include two front side busbars which are adjacent to each other, and the two front side busbars are close to the edge of the solar cell.

Preferably, the plurality of front side busbars may include two pairs of front side busbars, and two front side busbars of each pair of the two pairs of front side busbars are adjacent to each other, and one pair of the two pairs of front side busbars are close to the edge of the solar cell, and the other pair of the two pairs of front side busbars are not close to the edge of the solar cell.

According to a preferred embodiment of the present disclosure, the distribution of the plurality of back side busbars may correspond to the distribution of the plurality of front side busbars, such that after the solar cell is split into a plurality of solar cell strips, the front side busbar is adjacent to a long edge and an adjacent short edge of a corresponding solar cell strip, and the back side busbar is adjacent to an opposite long edge of the corresponding solar cell strip.

According to another aspect of the present disclosure, there is provided a shingled solar cell module which is fabricated from solar cell strips split from the solar cell according to any of the above embodiments.

According to a further aspect of the present disclosure, there is provided a method for fabricating a solar cell for a shingled solar cell module. The method comprises: arranging a plurality of back side busbars on a front side and a back side, the plurality of busbars dividing the solar cell into a plurality of sections, each section comprising a front side busbar and a back side busbar located at edges thereof, the busbar of at least one section of the solar cell having an extension at one end or both ends thereof, the extension extending along another edge of said at least one section intersecting with the edges.

According to a preferred embodiment of the present disclosure, in the method of fabricating a solar cell for a shingled solar cell module according to the present disclosure, the solar cell has chamfers, and an extension of the busbar of at least one chamfered section of the solar cell having a chamfer extends along another edge of the chamfered section intersecting with the edge where the busbar locates.

Preferably, in the method of making a solar cell for a shingled solar cell module according to the present disclosure, the extension may extend along a partial or entire area of the another edge of the chamfered section. Further preferably, the extension may extend along an entire area of the another edge of the chamfered section and continue to extend along a partial or entire area of a further edge of the chamfered section that abuts against the another edge.

According to a preferred embodiment of the present disclosure, in the method of making a solar cell for a shingled solar cell module according to the present disclosure, the extension may extends linearly with a constant width or with a non-constant width.

According to a preferred embodiment of the present disclosure, in the method of making a solar cell for use in a shingled solar cell module according to the present disclosure, the plurality of busbars may be a plurality of front side busbars. Alternatively, the plurality of busbars may be a plurality of back side busbars.

According to a preferred embodiment of the present disclosure, in the method of making a solar cell for use in a shingled solar cell module according to the present disclosure, the plurality of front side busbars are distributed evenly spaced apart on the front side.

According to a preferred embodiment of the present disclosure, in the method of making a cell for a shingled solar cell module according to the present disclosure, the plurality of front side busbars are distributed unevenly spaced apart on the front side.

Preferably, in the method of making a solar cell for a shingled solar cell module according to the present disclosure, the plurality of front side busbars may include two front side busbars which are adjacent to each other, and the two front side busbars are not close to the edge of the solar cell with respect to other front side busbars.

Preferably, in the method of making a solar cell for use in a shingled solar cell module according to the present disclosure, the plurality of front side busbars may include two pairs of front side busbars, and two front side busbars of each pair of the two pairs of front side busbars are adjacent to each other, and the two pairs of front side busbars are respectively close to one edge of the solar cell.

Preferably, in the method of making a solar cell for use in a shingled solar cell module according to the present disclosure, the plurality of front side busbars may include two front side busbars which are adjacent to each other, and the two front side busbars are close to the edge of the solar cell.

Preferably, in the method of fabricating a solar cell for use in a shingled solar cell module according to the present disclosure, the plurality of front side busbars may include two pairs of front side busbars, and two front side busbars of each pair of the two pairs of front side busbars are adjacent to each other, and one pair of the two pairs of front side busbars are close to the edge of the solar cell, and the other pair of the two pairs of front side busbars are not close to the edge of the solar cell.

According to a preferred embodiment of the present disclosure, in the method of making a solar cell for a shingled solar cell module according to the present disclosure, the busbar of at least one section of the solar cell having an extension at one end or both ends thereof is the front side busbar.

According to the method of the present disclosure, by the design of extending the busbar in the chamfered portion, it is possible to increase the current collecting capability of the busbar at the chamfered portion, thereby improving the EL imaging of the chamfered shingled solar cell module and improving the efficiency of the shingled solar cell module.

DETAILED DESCRIPTION OF EMBODIMENTS

The content of the present disclosure will be described below with reference to the figures. It may be appreciated by those skilled in the art that the present disclosure is not limited thereto, and equivalent content also fall within the scope of the present disclosure.

Figure 1:
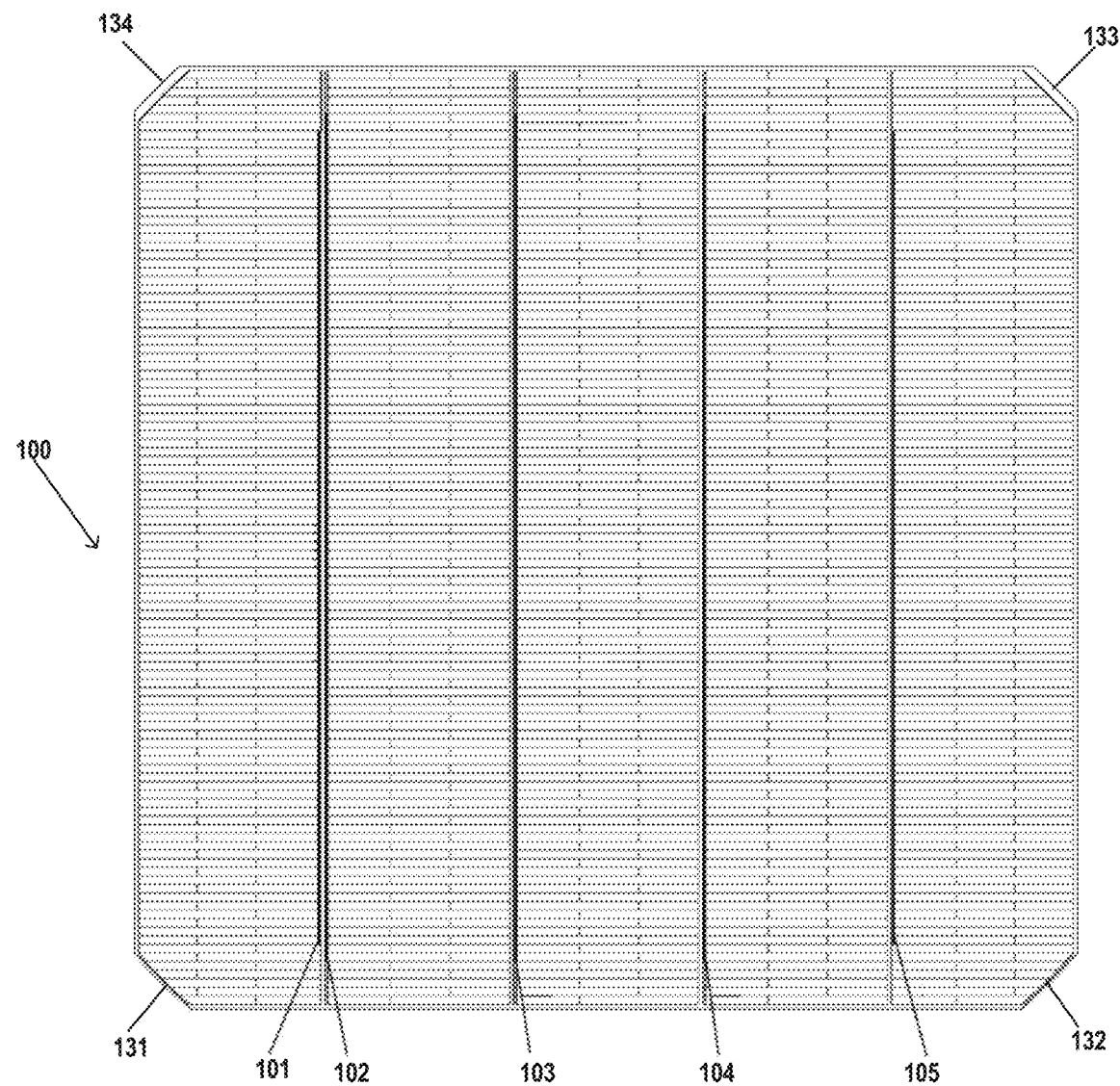
FIG. 1 and FIG. 2 show a front side and a back side of a solar cell according to the prior art in a top view and a bottom view, respectively.
Figure 2:
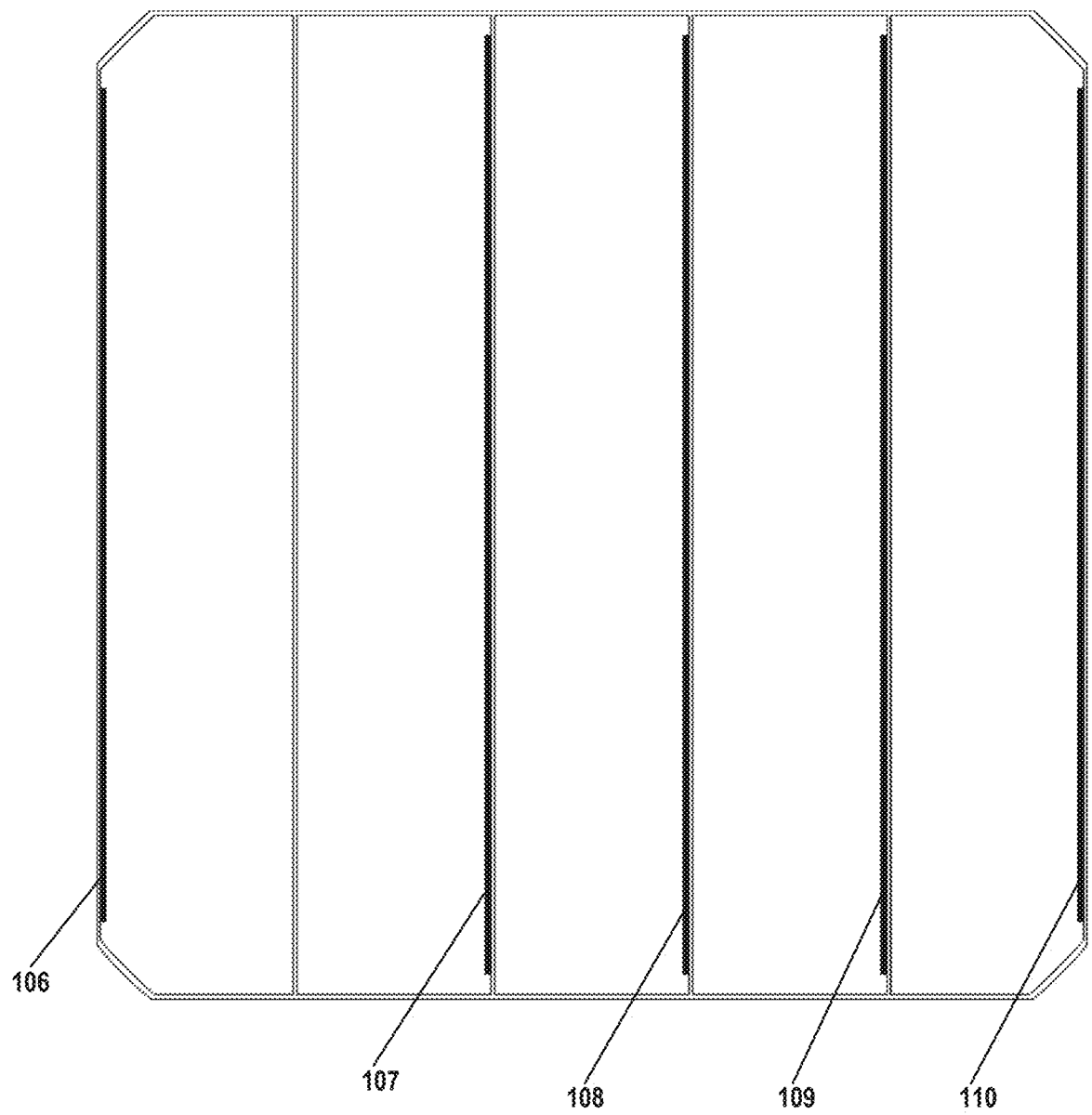

FIG. 1 and FIG. 2 show a front side and a back side of a solar cell according to the prior art in a top view and a bottom view, respectively. The solar cell 100 has chamfers 131, 132, 133, 134.

A plurality of front side busbars 101, 102, 103, 104, 105 are arranged on a front side of the solar cell, and a plurality of back side busbars 106, 107, 108, 109, 110 are arranged on a back side of the solar cell. The distribution of the plurality of back side busbars 106, 107, 108, 109, 110 corresponds to the distribution of the plurality of front side busbars 101, 102, 103, 104, 105 in such a manner that after the solar cell 100 is split into solar cell strips, each solar cell strip has a front side busbar on one side and a back side busbar on the opposite side.

As shown in FIG. 1 and FIG. 2, the solar cell 100 may be split into five solar cell strips. According to the sequence shown in FIGS. 1 and 2, from left to right, the first solar cell strip has a front side busbar 101 and a back side busbar 106, the second solar cell strip has a front side busbar 102 and a back side busbar 107, the third cell strip has a front side busbar 103 and a back side busbar 108, the fourth solar cell strip has a front side busbar 104 and a back side busbar 109, and the fifth solar cell strip has a front side busbar 105 and a back side busbar 110. In particular, the effective width of the busbar of the chamfered solar cell strip at the edge of the solar cell is shorter than at the middle, so when it is used to make the shingled solar cell module, the current collecting path of the chamfered part is longer and the resistance is higher, which causes the area to be darker than the middle in the EL imaging, affecting the power output of the module.

The present disclosure improves the prior art design of FIG. 1 and FIG. 2, and improves the EL imaging of the shingled solar cell module and improves the power of the shingled solar cell module by increasing the current collecting capability of the busbar, particularly the current collecting capability at the chamfered portion. FIG. 3 through FIG. 12 illustrate various preferred embodiments of a solar cell in accordance with the present disclosure.

Figure 3:
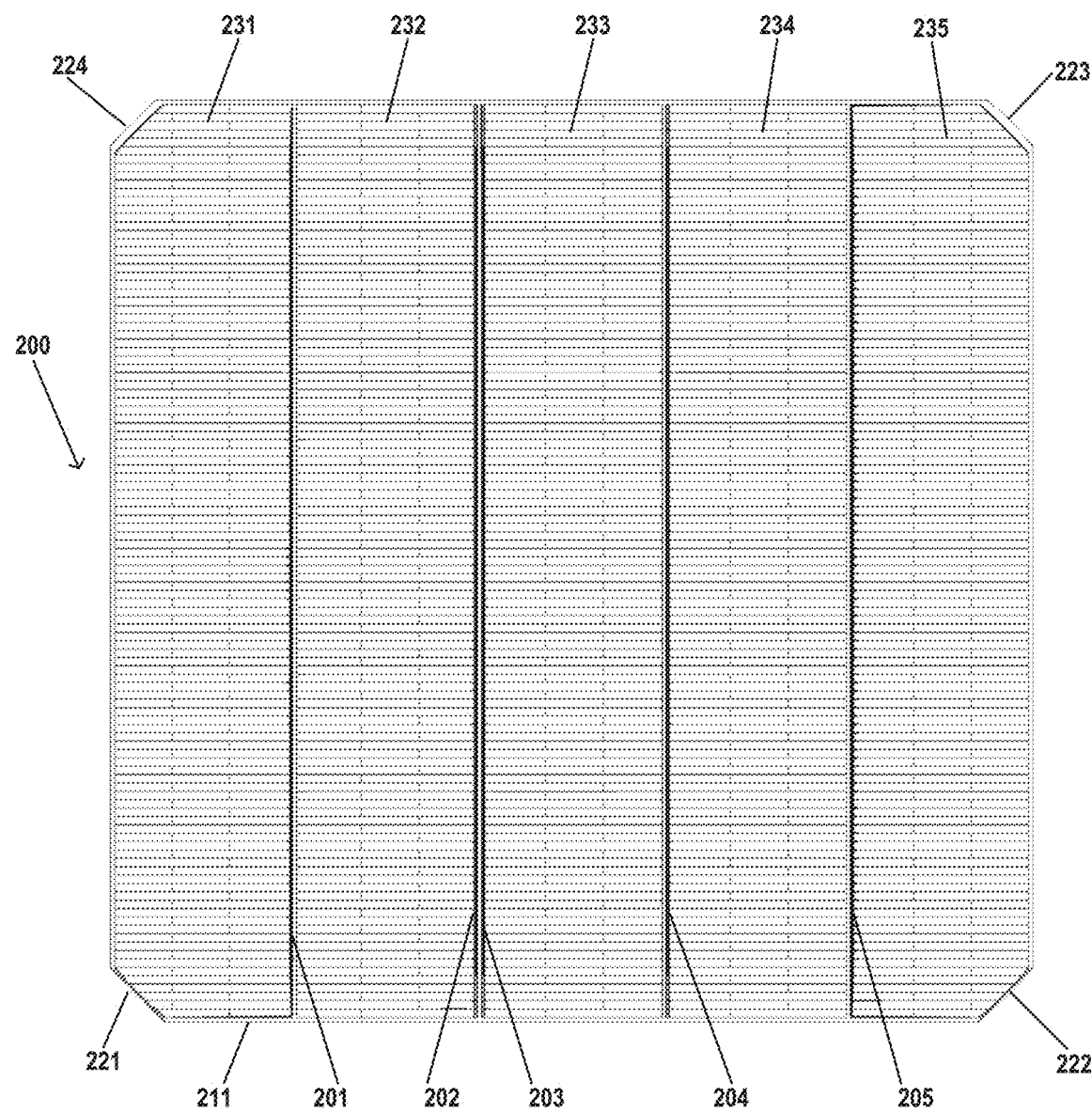
FIG. 3 and FIG. 4 show a front side and a back side of a solar cell according to a preferred embodiment of the present disclosure in a top view and a bottom view, respectively.
Figure 4:
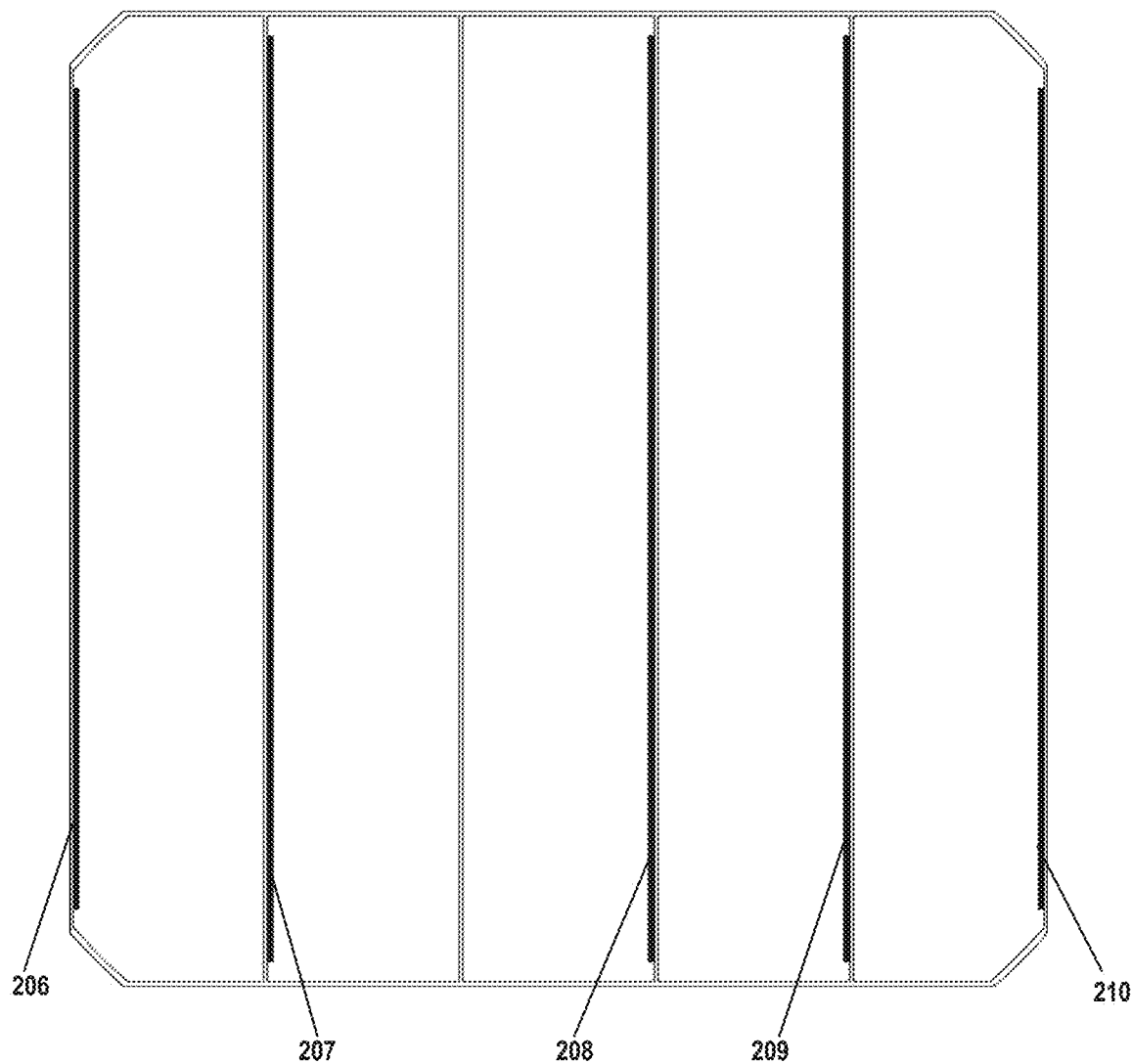

FIG. 3 and FIG. 4 show a front side and a back side of a solar cell according to a preferred embodiment of the present disclosure in a top view and a bottom view, respectively. The illustrated solar cell 200 is formed by slicing a square rod chamfered at four edges, so that the solar cell has a substantially square shape with four corners chamfered as viewed from the front side and the back side. That is, the solar cell 200 has chamfers 221, 222, 223, and 224.

A plurality of mutually parallel front side busbars 201, 202, 203, 204, 205 parallel to two of the edges of the solar cell are disposed on the front side, and a plurality of mutually parallel back side busbars 206, 207, 208, 209, 210 parallel to the same two edges of the solar cell are disposed on the back side. The solar cell includes a plurality of juxtaposed sections 231, 232, 233, 234, 235, and each section includes one front side busbar and one back side busbar.

In this embodiment, the plurality of front side busbars 201, 202, 203, 204, 205 are distributed unevenly spaced apart on the front side. The plurality of front side busbars 201, 202, 203, 204, 205 include two front side busbars 202, 203 which are adjacent to each other, and the two front side busbars 202, 203 are not close to the edge of the solar cell with respect to other front side busbars. In the present embodiment, two front side busbars 202, 203 are located on the section close to the center of the solar cell. However, the present disclosure is not limited thereto. In other embodiments, the plurality of front side busbars may be distributed evenly spaced apart on the front side, and the front side busbar may be close to the edge of the solar cell.

The distribution of the plurality of back side busbars 206, 207, 208, 209, 210 corresponds to the distribution of the plurality of front side busbars 201, 202, 203, 204, 205 in such a manner that after the solar cell 200 is split into the solar cell strips with the above-mentioned sections, each of the solar cell strips has a front side busbar on a long edge and a back side busbar on an opposite long edge, and at least one solar cell strip has a front side busbar on the long edge and a short edge intersecting therewith. As shown in FIG. 3 and FIG. 4, the solar cell 200 may be split into five solar cell strips. According to the sequence shown in FIGS. 3 and 4, from left to right, the first solar cell strip has a front side busbar 201 and a back side busbar 206, the second solar cell strip has a front side busbar 202 and a back side busbar 207, the third solar cell strip has a front side busbar 203 and a back side busbar 208, the fourth solar cell strip has a front side busbar 204 and a back side busbar 209, and the fifth solar cell strip has a front side busbar 205 and a back side busbar 210. As described above, each of the first to fifth solar cell strips has a front side busbar on a long edge and a back side busbar on an opposite long edge, and at least one solar cell strip in the first to fifth solar cell strips has a front side busbar at the long edge on one side and a short edge intersecting therewith, that is, has a busbar at the long edge and has an extension of the busbar at a short edge intersecting therewith.

Specifically, the two outermost solar cell strips of the first to fifth solar cell strips, that is, the first solar cell strip and the fifth solar cell strip have chamfers. The first solar cell strip is also the left side chamfered section 231, and the fifth solar cell strip is also the right side chamfered section 235.

Figure 5:
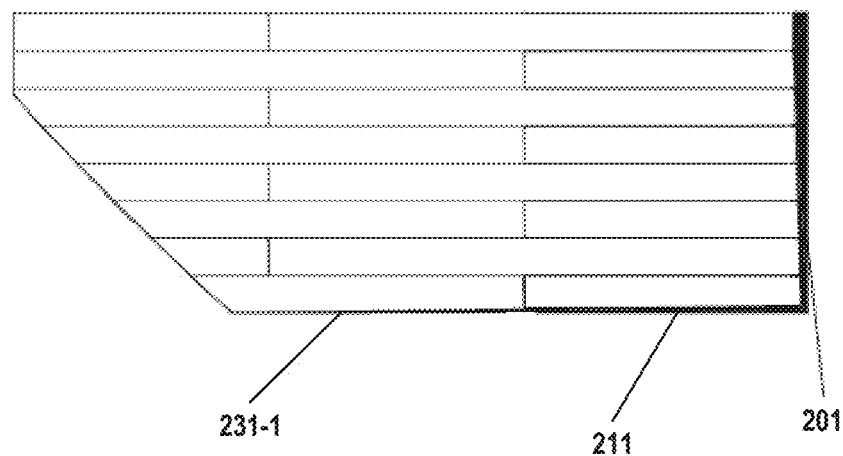
FIG. 5 shows a partial enlarged view showing a chamfered area of the solar cell of FIG. 3 and FIG. 4.

The front side busbar 201 of the left side chamfered section 231 having a chamfer extends along the long edge on the side without chamfer, and after reaching the short edge intersecting (orthogonal in the present embodiment in the figure) the long edge, the front side busbar 201 continues to extend along the short edge, i.e., has an extension 211 of the busbar. FIG. 5 shows a partial enlarged view showing a chamfered 221 area of the solar cell. The extension 211 of the busbar 201 can be more clearly seen in FIG. 5. As shown, the extension 211 extends along the short edge 231-1 of the chamfered section 231. The extension 211 may extend all the way to the chamfer 221 or may extend only along a partial area of the short edge 231-1 without extending to the chamfer 221. The extension 211 may be linearly and not gradually varied, that is, have a constant width, or may be linearly and gradually varied, that is, have a variable width.

By designing the extension of the front side busbar at the intersecting short edge or near the chamfer of the solar cell, it is possible to enhance the current collecting capability of the solar cell and increase the power of the shingled solar cell module.

Similarly, the front side busbar 205 of the fifth solar cell strip, namely, of the right side chamfered section 235 extends along the long edge of the side without a chamfer, and after reaching the short edge intersecting (orthogonal in the present embodiment in the figure) with the long edge, the front side busbar 205 continues to extend along the short edge, i.e., has an extension of the busbar, the extension extends along the short edge of the right side chamfered section 235, the extension may extend all the way to the chamfer 222, or may extend only along a partial area of the short edge without extending to the chamfer 222.

Certainly, in the embodiment shown in the figures, the extension of the busbar is located on the lower short edge that intersects the long edge of the solar cell strip. As will be understood by those skilled in the art, the extension of the busbar may be disposed at the short edge on either side or at both the upper short edge and lower short edge which intersect with the long edge.

Figure 6:
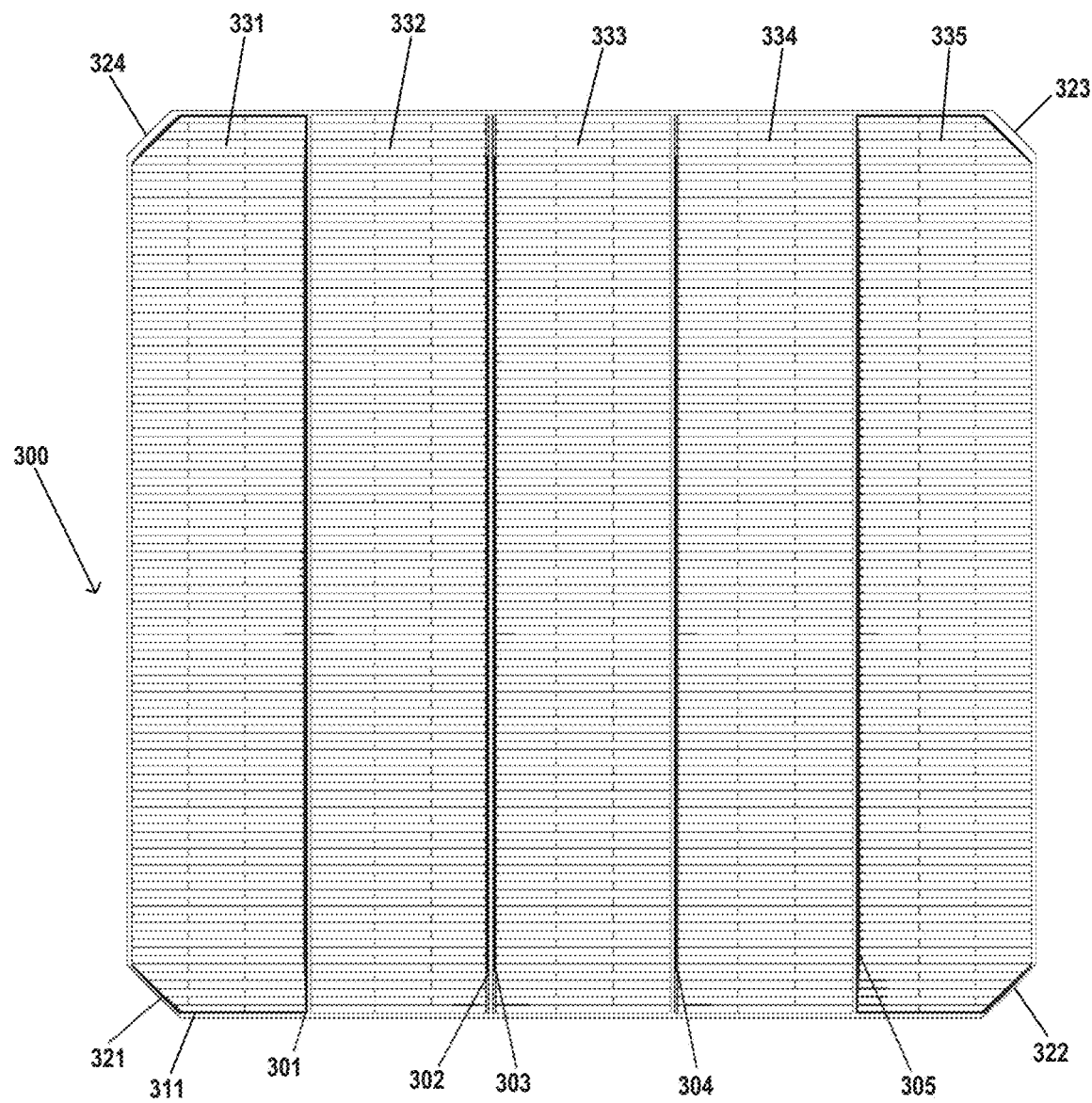
FIG. 6 and FIG. 7 show a front side and a back side of a solar cell according to another preferred embodiment of the present disclosure in a top view and a bottom view, respectively.
Figure 7:
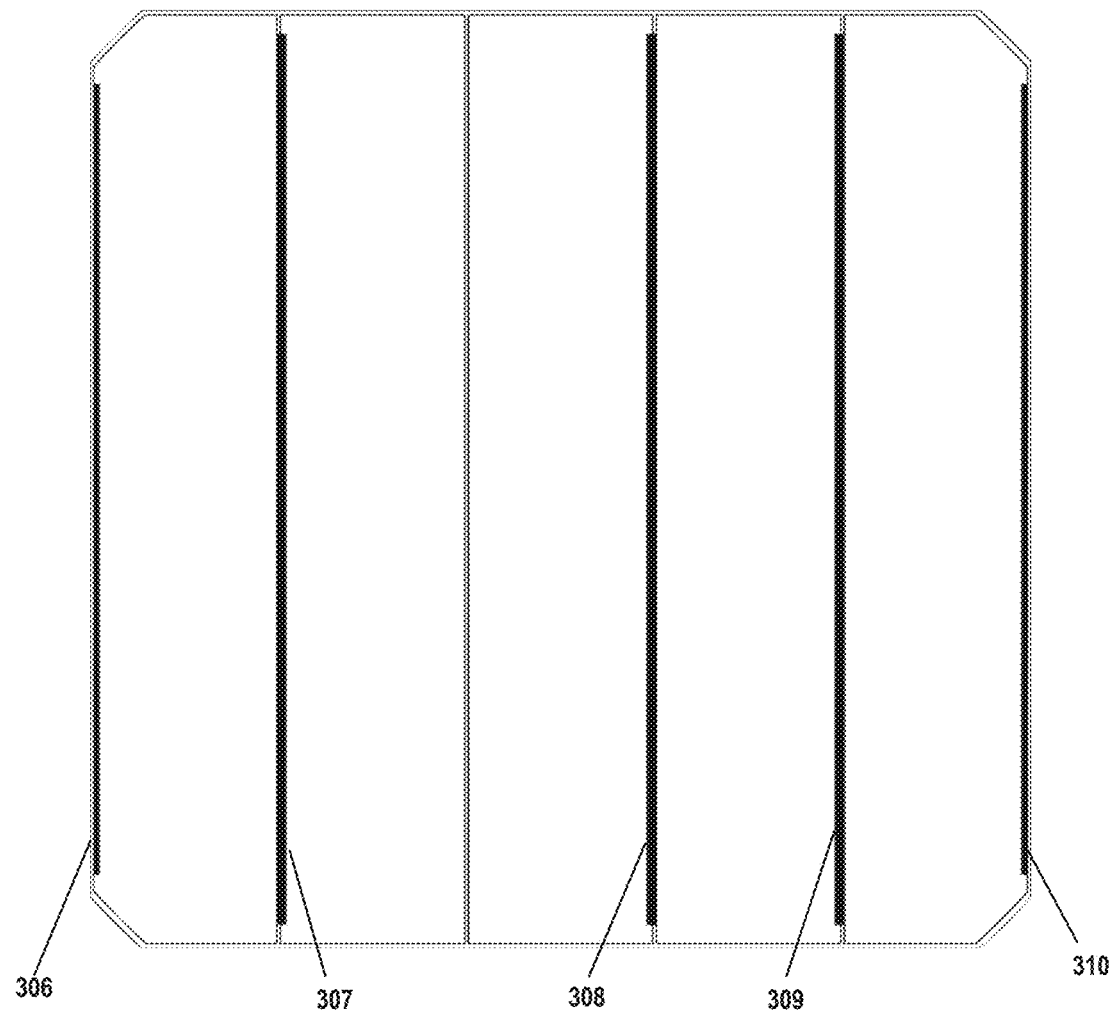

FIG. 6 and FIG. 7 show a front side and a back side of a solar cell 300 according to another preferred embodiment of the present disclosure in a top view and a bottom view, respectively. The illustrated solar cell 300 is formed by slicing a square rod chamfered at four edges, so that the solar cell has a substantially square shape with four corners chamfered as viewed from the front side and the back side. That is, the solar cell 300 has chamfers 321, 322, 323, and 324.

A plurality of mutually parallel front side busbars 301, 302, 303, 304, 305 parallel to two of the edges of the solar cell are disposed on the front side, and a plurality of mutually parallel back side busbars 306, 307, 308, 309, 310 parallel to the same two edges of the solar cell are disposed on the back side. The solar cell includes a plurality of juxtaposed sections 331, 332, 333, 334, 335, and each section includes one front side busbar and one back side busbar.

In the embodiment shown in FIG. 6 and FIG. 7, the arrangement of the plurality of front side busbars and the plurality of back side busbars is the same as that of the embodiment shown in FIG. 3 and FIG. 4, and details are not described herein again.

Figure 8:
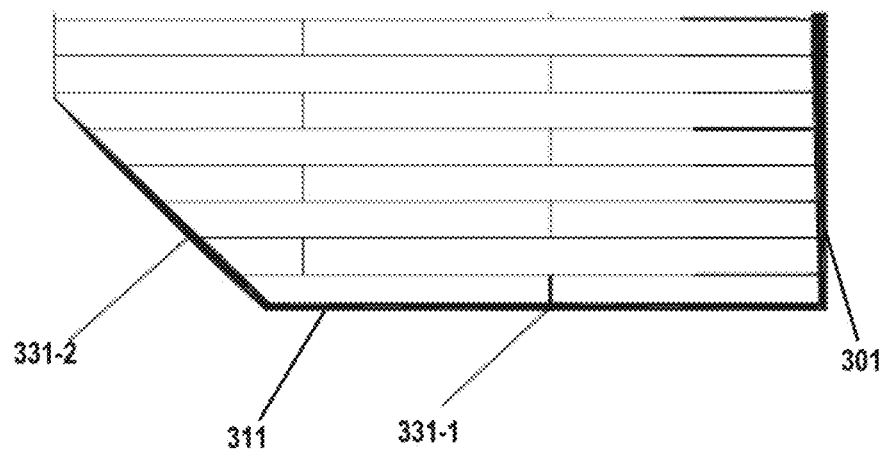
FIG. 8 shows a partial enlarged view showing a chamfered area of the solar cell of FIG. 6 and FIG. 7.

The front side busbar 301 of the chamfered left section 331 extends along the long edge on the side without chamfer, and after reaching the short edge intersecting the long edge, the front side busbar 301 continues to extend along the short edge, i.e., has an extension 311 of the busbar. FIG. 8 shows a partial enlarged view showing a chamfered 321 area of the solar cell. The extension 311 of the busbar 301 can be more clearly seen in FIG. 8. In the present embodiment, the extension 311 extends along an entire area of the short edge 331-1 of the chamfered section 331 and continues to extend along the chamfered edge 331-2 of the chamfered section 331. The extension 311 may extend along the entire area of the chamfered edge 331-2 or may extend only along a partial area of the chamfered edge 331-2. The extension 311 may be linearly and not gradually varied, that is, have a constant width, or may be linearly and gradually varied, that is, have a variable width.

On the other side of the solar cell, the busbar 305 of another chamfered section 335 may also have an extension that may extend along the short edge of the another chamfered section 335. The extension extends all the way to the chamfer 322, or may extend only along a partial area of the short edge of the another chamfered section 335 without extending to the chamfer 322. Further preferably, the extension of the busbar 305 may extend along the entire short edge of the another chamfered section 335 and continue to extend along a partial or entire area of the chamfered edge of the another chamfered section 335.

Certainly, in the embodiment shown in the figure, the extension of the busbar is located on the lower short edge that intersects the long edge of the solar cell strip. As will be understood by those skilled in the art, the extension of the busbar may be disposed at the short edge on either side or at both the upper short edge and lower short edge which intersect with the long edge.

Figure 9:
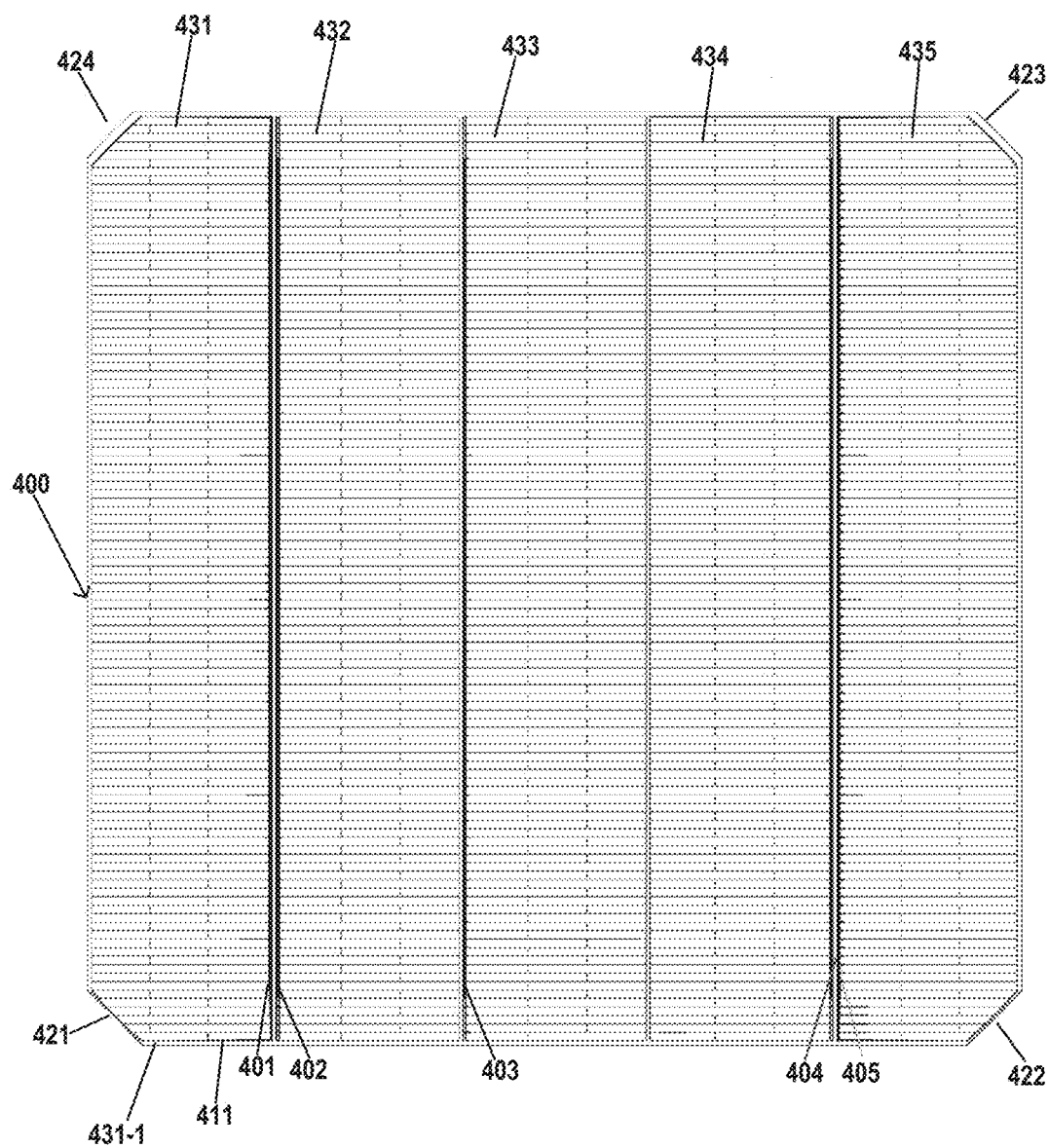
FIG. 9 and FIG. 10 show a front side and a back side of a solar cell according to a further preferred embodiment of the present disclosure in a top view and a bottom view, respectively.
Figure 10:
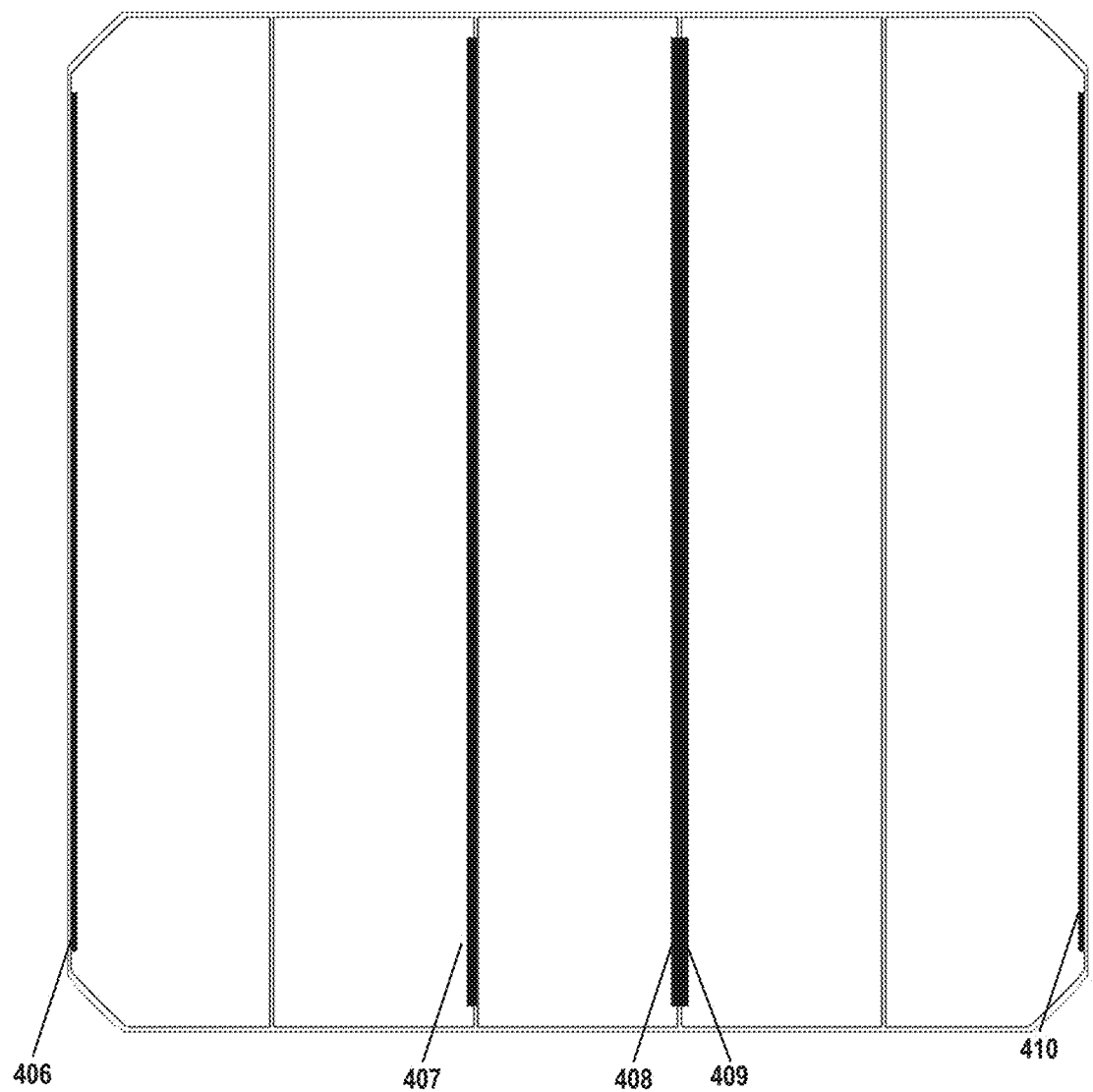

FIG. 9 and FIG. 10 show a front side and a back side of a solar cell 400 according to a preferred embodiment of the present disclosure in a top view and a bottom view, respectively. The illustrated solar cell 400 is formed by slicing a square rod chamfered at four edges, so that the solar cell has a substantially square shape with four corners chamfered as viewed from the front side and the back side. That is, the solar cell 400 has chamfers 421, 422, 423, and 424.

A plurality of mutually parallel front side busbars 401, 402, 403, 404, 405 parallel to two of the edges of the solar cell are disposed on the front side, and a plurality of mutually parallel back side busbars 406, 407, 408, 409, 410 parallel to the same two edges of the solar cell are disposed on the back side. The solar cell includes a plurality of juxtaposed sections 431, 432, 433, 434, 435, and each section includes one front side busbar and one back side busbar.

In the present embodiment, the plurality of front side busbars 401, 402, 403, 404, 405 are distributed unevenly spaced apart on the front side. The plurality of front side busbars 401, 402, 403, 404, 405 include two pairs of front side busbars 401, 402 and 404, 405, two front side busbars of the two pairs of front side busbars are adjacent to each other, and the two pairs of front side busbars 401, 402 and 404, 405 are respectively close to the edges of the solar cell. However, the present disclosure is not limited thereto. In other embodiments, the plurality of front side busbars may be distributed evenly spaced apart on the front side, and the front side busbar may not be close to the edge of the solar cell.

The distribution of the plurality of back side busbars 406, 407, 408, 409, 410 corresponds to the distribution of the plurality of front side busbars 401, 402, 403, 404, 405 in such a manner that after the solar cell 400 is split into a plurality of solar cell strips with the above-mentioned sections, each of the solar cell strips has a front side busbar at a long edge and a back side busbar at an opposite long edge.

As shown in FIG. 9 and FIG. 10, the solar cell 400 may be split into five solar cell strips. According to the sequence shown in FIGS. 9 and 10, from left to right, the first solar cell strip has a front side busbar 401 and a back side busbar 406, the second solar cell strip has a front side busbar 402 and a back side busbar 407, the third solar cell strip has a front side busbar 403 and a back side busbar 408, and the fourth solar cell strip has a front side busbar 404 and a back side busbar 409, the fifth solar cell strip has a front side busbar 405 and a back side busbar 410. As described above, each of the first to fifth solar cell strips has a front side busbar at a long edge and a back side busbar at an opposite long edge, and at least one solar cell strip in the first to fifth solar cell strips has a front side busbar at the long edge on one side and a short edge intersecting therewith, that is, has a busbar at the long edge and has an extension of the busbar at a short edge intersecting therewith.

Specifically, the two outermost solar cell strips of the first to fifth solar cell strips, that is, the first solar cell strip and the fifth solar cell strip have chamfers. The first solar cell strip is also the left side chamfered section 431, and the fifth solar cell strip is also the right side chamfered section 435. The front side busbar 401 of the left side chamfered section 431 along the long edge on the side without chamfer, and after reaching the short edge intersecting (orthogonal in the present embodiment in the figure) the long edge, the front side busbar 401 continues to extend along the short edge, i.e., has an extension 411 of the busbar. The extension 411 extends towards the chamfer 421 along the intersecting short edge 431-1 of the chamfered section 431. The extension 411 may extend all the way to the chamfer 421 or may extend only along a partial area of the intersecting short edge 431-1 of the chamfered section 431. The extension 411 may be linearly and not gradually varied, that is, have a constant width, or may be linearly and gradually varied, that is, have a variable width.

By designing the extension of the front side busbar at the end edge or near the chamfer of the solar cell, it is possible to enhance the current collecting capability of the solar cell and increase the power of the shingled solar cell module.

Similarly, the front side busbar 405 of the fifth solar cell strip, namely, of the right side chamfered section 435 extends along the long edge of the side without a chamfer, and after reaching the short edge intersecting with the long edge, the front side busbar 405 continues to extend along the short edge, i.e., has an extension of the busbar, the extension extends along the short edge of the right side chamfered section 435, the extension may extend all the way to the chamfer 422, or may extend only along a partial area of the short edge of another chamfered section 435 without extending to the chamfer 422.

Certainly, in the embodiment shown in the figures, the extension of the busbar is located on the lower short edge that intersects the long edge of the solar cell strip. As will be understood by those skilled in the art, the extension of the busbar may be disposed at the short edge on either side or at both the upper short edge and lower short edge which intersect with the long edge.

Figure 11:
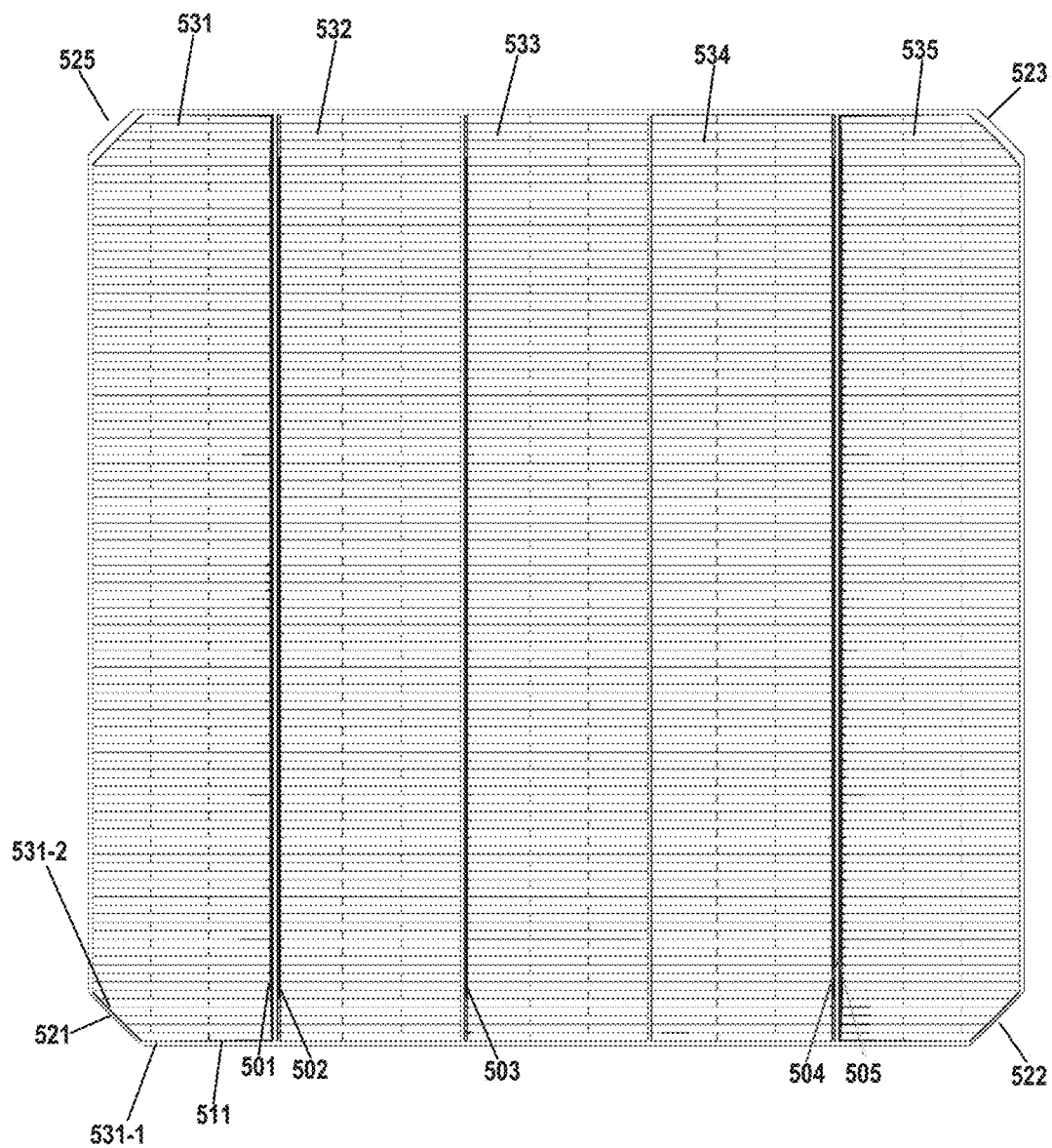
FIG. 11 and FIG. 12 show a front side and a back side of a solar cell according to a further preferred embodiment of the present disclosure in a top view and a bottom view, respectively.
Figure 12:
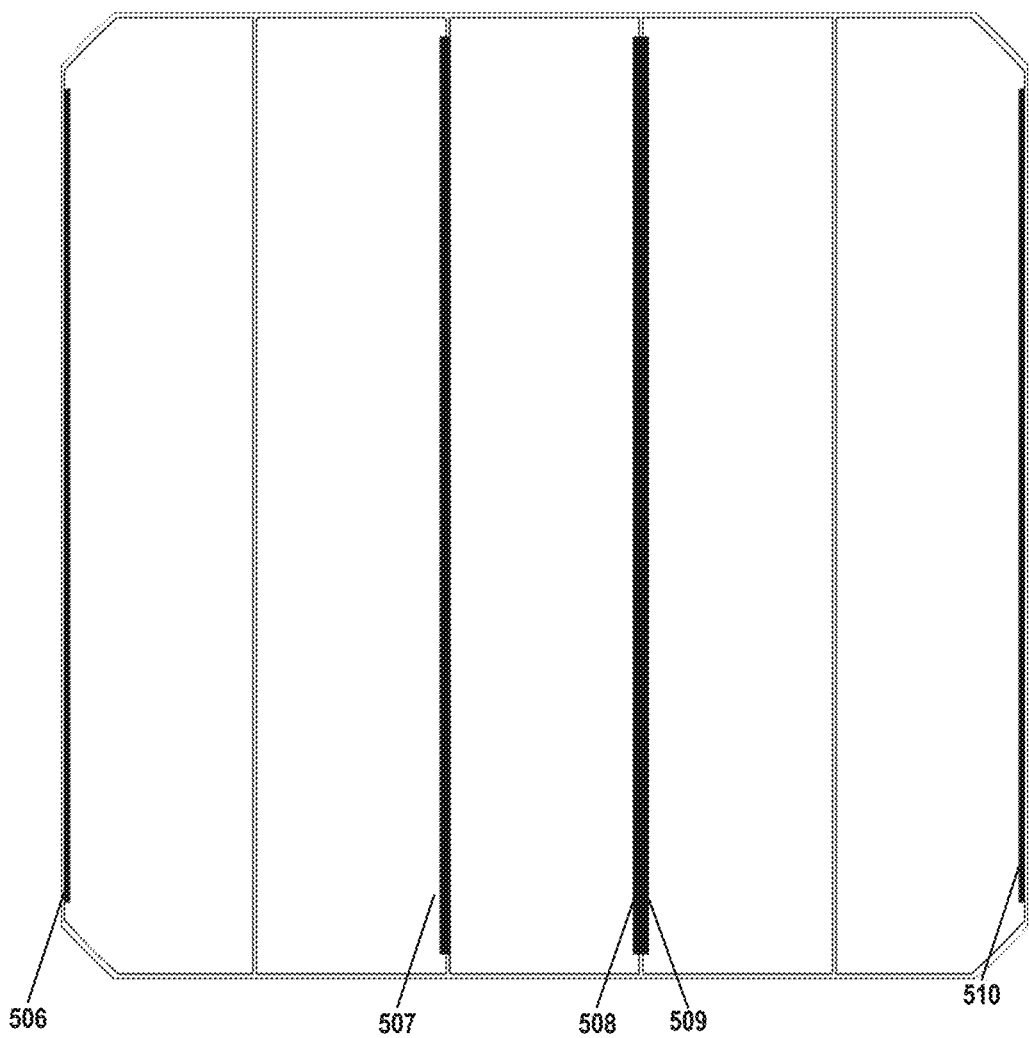

FIG. 11 and FIG. 12 show a front side and a back side of a solar cell 500 according to a preferred embodiment of the present disclosure in a top view and a bottom view, respectively. The illustrated solar cell 500 is formed by slicing a square rod chamfered at four edges, so that the solar cell has a substantially square shape with four corners chamfered as viewed from the front side and the back side. That is, the solar cell 500 has chamfers 521, 522, 523, and 524.

A plurality of mutually parallel front side busbars 501, 502, 503, 504, 505 parallel to two of the edges of the solar cell are disposed on the front side, and a plurality of mutually parallel back side busbars 506, 507, 508, 509, 510 parallel to the same two edges of the solar cell are disposed on the back side. The arrangement of the plurality of front side busbars and the plurality of back side busbars is the same as that of the embodiment shown in FIG. 7 and FIG. 8, and details are not described herein again.

The front side busbar 501 of the left side chamfered section 531 extends along the long edge on the side without chamfer, and after reaching the short edge intersecting the long edge, the front side busbar 501 continues to extend along the short edge, i.e., has an extension 511 of the busbar. The extension 511 extends along an entire area of the short edge 531-1 of the chamfered section 531 and continues to extend along the chamfered edge 531-2 of the chamfered section 531. The extension 511 may extend along the entire area of the chamfered edge 531-2 or may extend only along a partial area of the chamfered edge 531-2. The extension 511 may be linearly and not gradually varied, that is, have a constant width, or may be linearly and gradually varied, that is, have a variable width.

Similarly, the front side busbar 505 of the fifth solar cell strip, namely, of the right side chamfered section 523 extends along the long edge of the side without a chamfer, and after reaching the short edge intersecting with the long edge, the front side busbar 505 continues to extend along the short edge, i.e., has an extension of the busbar, the extension extends along the short edge of another chamfered section 523, the extension may extend all the way to the chamfer 522, or may extend only along a partial area of the short edge of another chamfered section 523 without extending to the chamfer 522. Further preferably, the extension of the busbar 505 may extend along the entire short edge of the another chamfered section 523 and continue to extend along a partial or entire area of the chamfered edge of the another chamfered section 523.

Certainly, in the embodiment shown in the figures, the extension of the busbar is located on the lower short edge that intersects the long edge of the solar cell strip. As will be understood by those skilled in the art, the extension of the busbar may be disposed at the short edge on either side or at both the upper short edge and lower short edge which intersect with the long edge.

Figure 13:
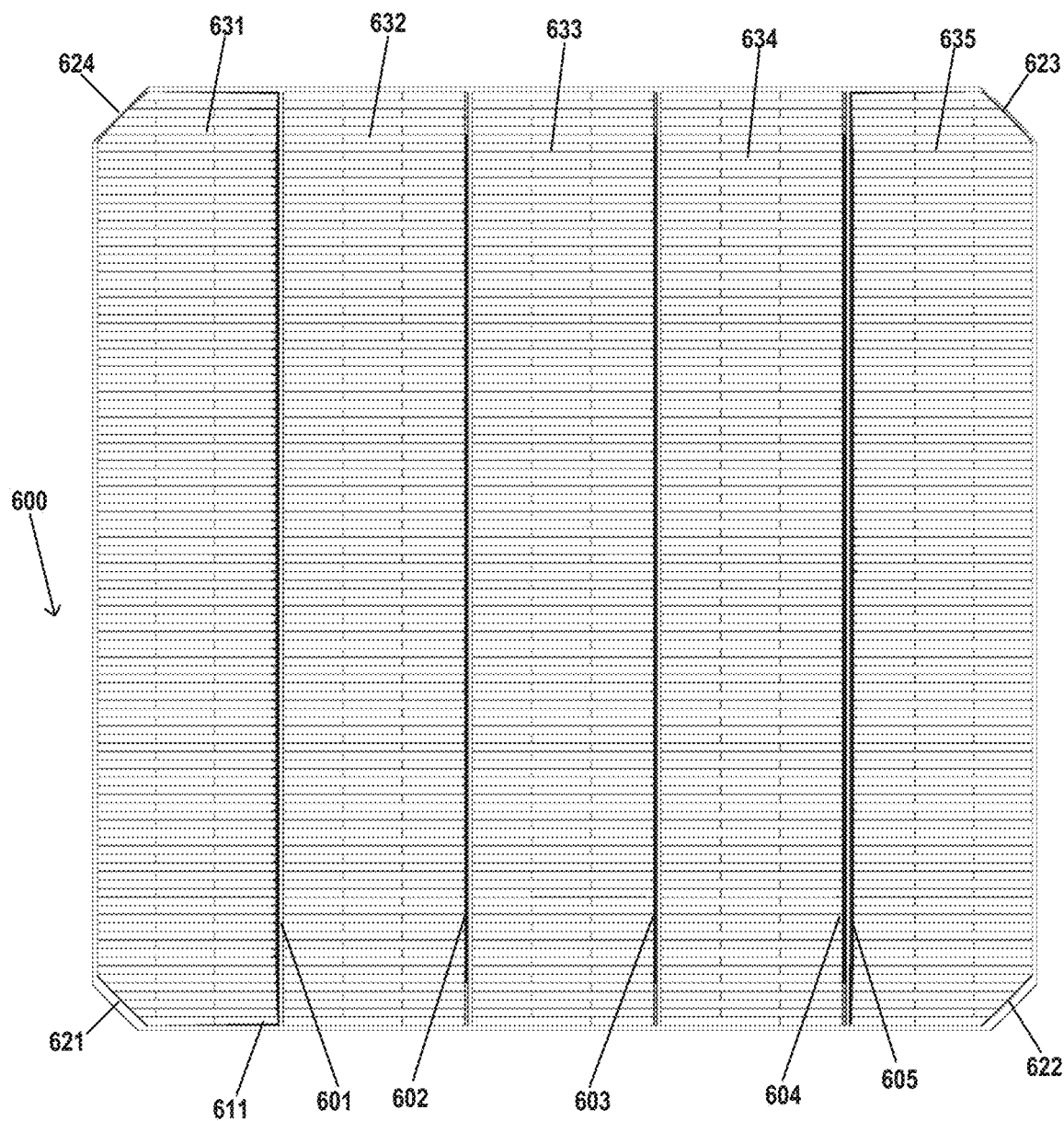
FIG. 13 and FIG. 14 show a front side and a back side of a solar cell according to a further preferred embodiment of the present disclosure in a top view and a bottom view, respectively.
Figure 14:
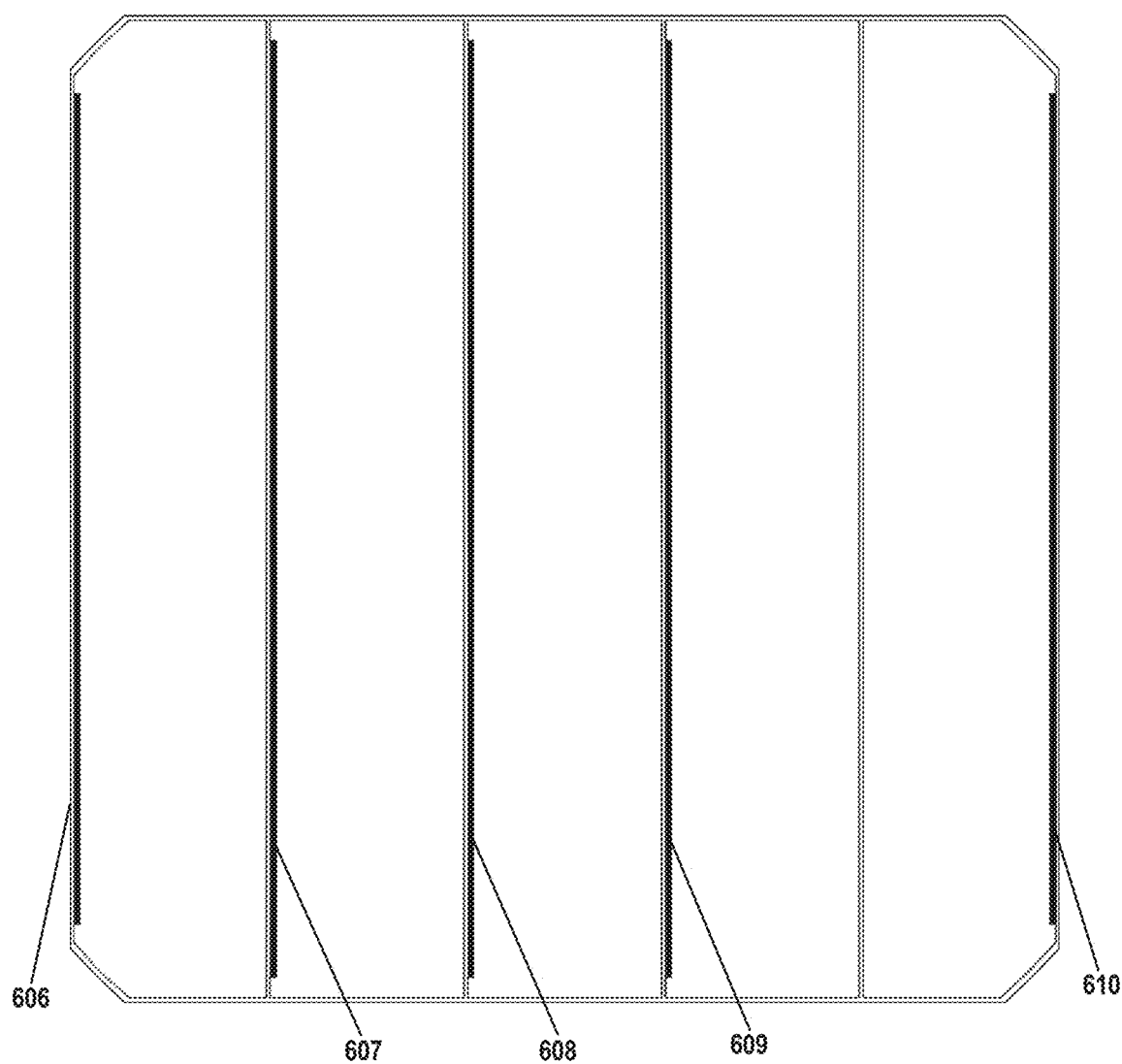

FIG. 13 and FIG. 14 show a front side and a back side of a solar cell 600 according to a preferred embodiment of the present disclosure in a top view and a bottom view, respectively. The illustrated solar cell 600 is formed by slicing a square rod chamfered at four edges, so that the solar cell has a substantially square shape with four corners chamfered as viewed from the front side and the back side. That is, the solar cell 600 has chamfers 621, 622, 623, and 624.

A plurality of mutually parallel front side busbars 601, 602, 603, 604, 605 parallel to two of the edges of the solar cell are disposed on the front side, and a plurality of mutually parallel back side busbars 606, 607, 608, 609, 610 parallel to the same two edges of the solar cell are disposed on the back side. The solar cell includes a plurality of juxtaposed sections 631, 632, 633, 634, 635, and each section includes one front side busbar and one back side busbar.

In the embodiment, the plurality of front side busbars 601, 602, 603, 604, 605 are distributed unevenly spaced apart on the front side. The plurality of front side busbars 601, 602, 603, 604, 605 include two front side busbars 604, 605 which are adjacent to each other, and the two front side busbars 604, 605 are close to the edge of the solar cell with respect to other front side busbars. In the present embodiment, two front side busbars 604, 605 are located on the section at the outermost edge.

The distribution of the plurality of back side busbars 606, 607, 608, 609, 610 corresponds to the distribution of the plurality of front side busbars 601, 602, 603, 604, 605 in such a manner that after the solar cell 600 is split into the solar cell strips with the above-mentioned sections, each of the solar cell strips has a front side busbar at a long edge and a back side busbar on an opposite long edge, and at least one solar cell strip has a front side busbar at the long edge on one side and a short edge intersecting therewith. As shown in FIG. 13 and FIG. 14, the solar cell 600 may be split into five solar cell strips. According to the sequence shown in FIGS. 13 and 14, from left to right, the first solar cell strip has a front side busbar 601 and a back side busbar 606, the second solar cell strip has a front side busbar 602 and a back side busbar 607, the third solar cell strip has a front side busbar 603 and a back side busbar 608, and the fourth solar cell strip has a front side busbar 604 and a back side busbar 609, and the fifth solar cell strip has a front side busbar 605 and a back side busbar 610. As described above, each of the first to fifth solar cell strips has a front side busbar at a long edge and a back side busbar at an opposite long edge, and at least one solar cell strip in the first to fifth solar cell strips has a front side busbar at the long edge on one side and a short edge intersecting therewith, that is, has a busbar at the long edge and has an extension of the busbar at a short edge intersecting therewith.

Specifically, the two outermost solar cell strips of the first to fifth solar cell strips, that is, the first solar cell strip and the fifth solar cell strip have chamfers. The first solar cell strip is also the left side chamfered section 631, and the fifth solar cell strip is also the right side chamfered section 635. The front side busbar 601 of the left side chamfered section 631 extends along the long edge on the side without chamfer, and after reaching the short edge intersecting (orthogonal in the present embodiment in the figure) the long edge, the front side busbar 601 continues to extend along the short edge, i.e., has an extension 611 of the busbar. As shown, the extension 611 extends along the short edge 631-1 of the chamfered section 631. The extension 611 may extend all the way to the chamfer 621 or may extend only along a partial area of the short edge 631-1 without extending to the chamfer 621. The extension 611 may be linearly and not gradually varied, that is, have a constant width, or may be linearly and gradually varied, that is, have a variable width.

By designing the extension of the front side busbar at the intersecting short edge or near the chamfer of the solar cell, it is possible to enhance the current collecting capability of the solar cell and increase the efficiency of the shingled solar cell module.

Similarly, the front side busbar 605 of the fifth solar cell strip, namely, of the right side chamfered section 635 extends along the long edge of the side without a chamfer, and after reaching the short edge intersecting (orthogonal in the present embodiment in the figure) with the long edge, the front side busbar 605 continues to extend along the short edge, i.e., has an extension of the busbar, the extension extends along the short edge of the right side chamfered section 635, the extension may extend all the way to the chamfer 622, or may extend only along a partial area of the short edge without extending to the chamfer 622.

Certainly, in the embodiment shown in the figures, the extension of the busbar is located on the lower short edge that intersects the long edge of the solar cell strip. As will be understood by those skilled in the art, the extension of the busbar may be disposed at the short edge on either side or at both the upper short edge and lower short edge which intersect with the long edge.

Figure 15:
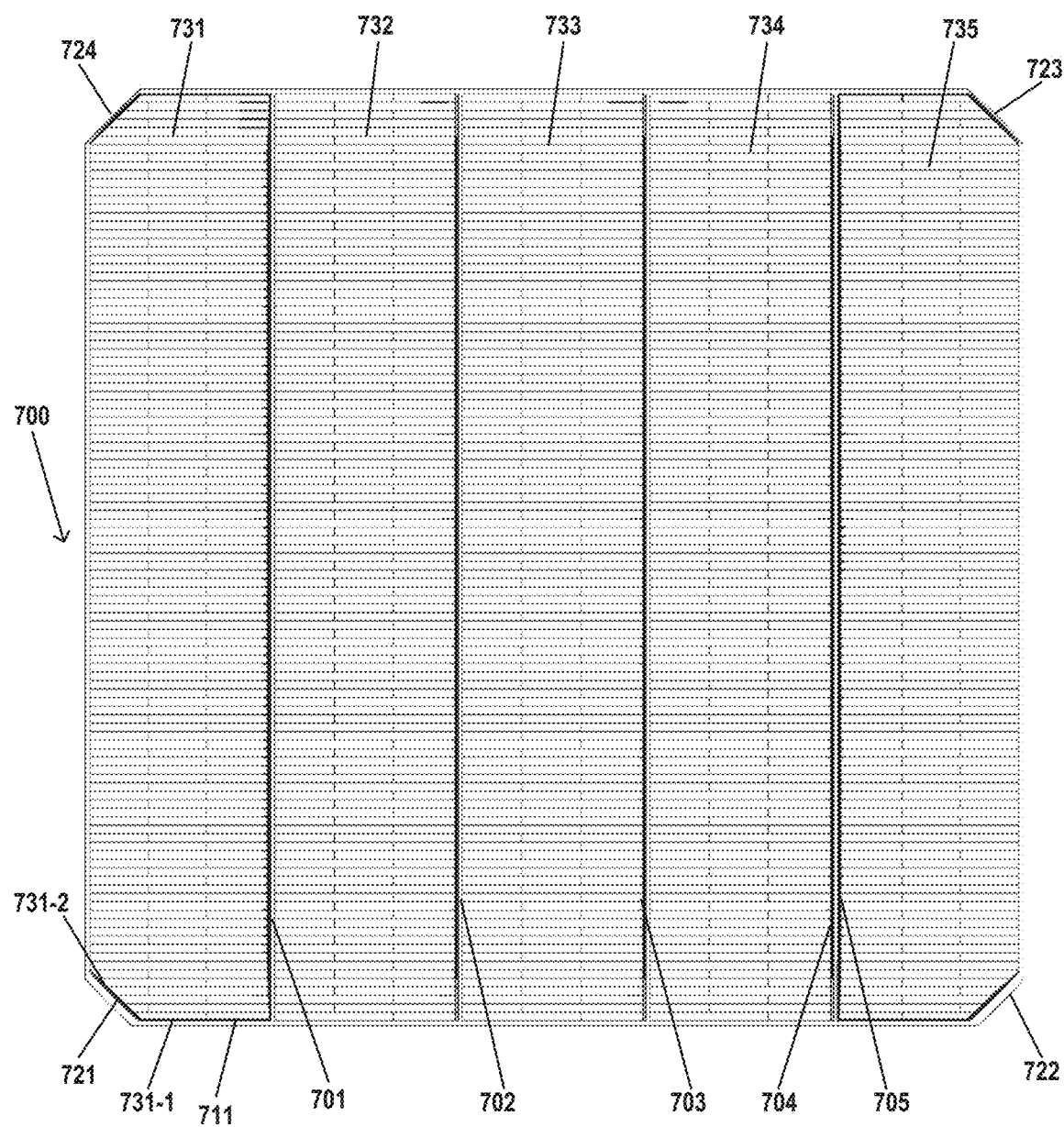
FIG. 15 and FIG. 16 show a front side and a back side of a solar cell according to a further preferred embodiment of the present disclosure in a top view and a bottom view, respectively.
Figure 16:
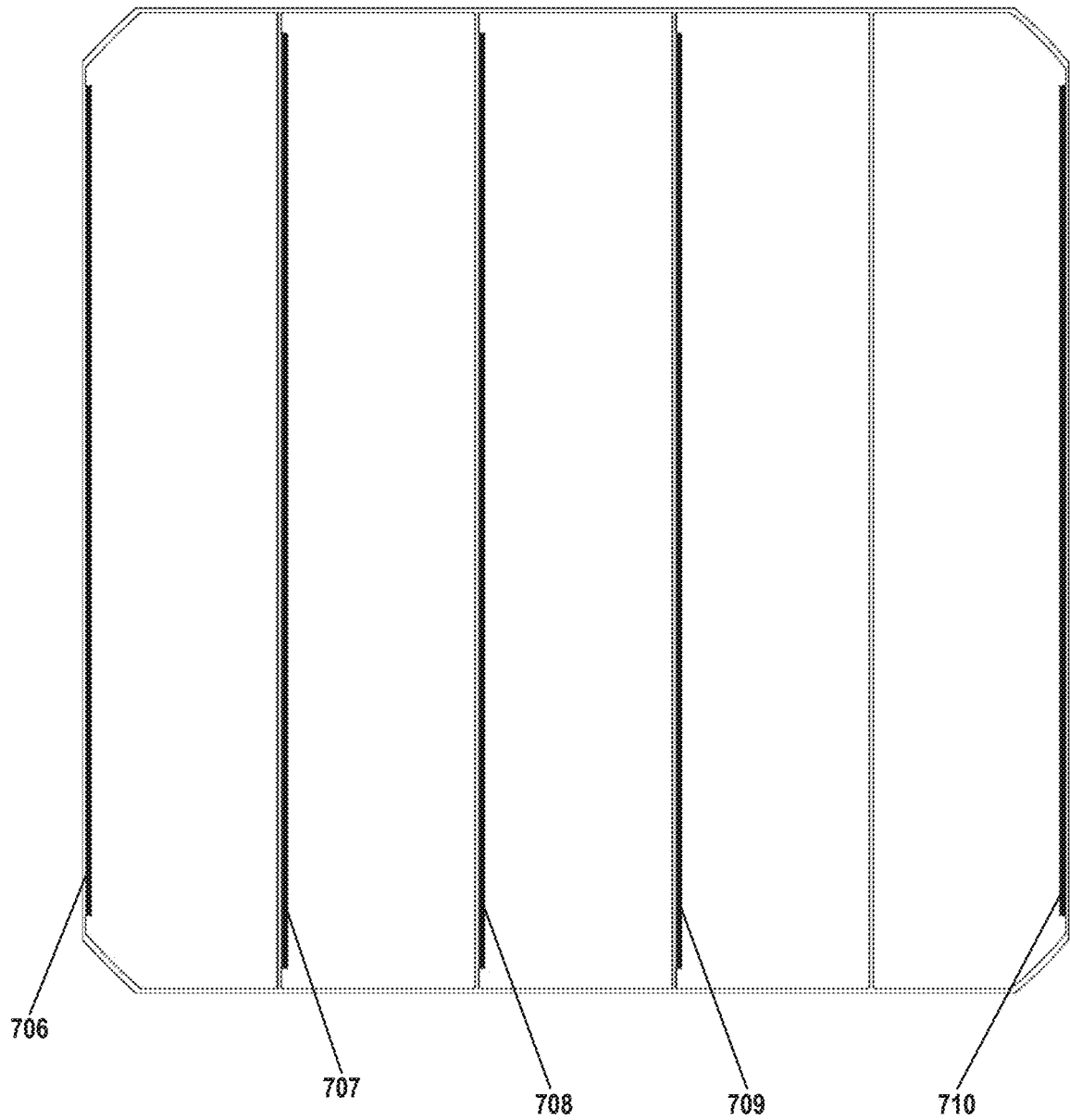

FIG. 15 and FIG. 16 show a front side and a back side of a solar cell 700 according to another preferred embodiment of the present disclosure in a top view and a bottom view, respectively. The illustrated solar cell 700 is formed by slicing a square rod chamfered at four edges, so that the solar cell has a substantially square shape with four corners chamfered as viewed from the front side and the back side. That is, the solar cell 700 has chamfers 721, 722, 723, and 724.

A plurality of mutually parallel front side busbars 701, 702, 703, 704, 705 parallel to two of the edges of the solar cell are disposed on the front side, and a plurality of mutually parallel back side busbars 706, 707, 708, 709, 710 parallel to the same two edges of the solar cell are disposed on the back side. The solar cell includes a plurality of juxtaposed sections 731, 732, 733, 734, 735, and each section includes one front side busbar and one back side busbar.

In the embodiment shown in FIG. 15 and FIG. 16, the arrangement of the plurality of front side busbars and the plurality of back side busbars is the same as that of the embodiment shown in FIG. 13 and FIG. 14, and details are not described herein again.

The front side busbar 701 of the left side chamfered section 731 extends along the long edge on the side without chamfer, and after reaching the short edge intersecting (orthogonal in the embodiment in the figure) the long edge, the front side busbar 701 continues to extend along the short edge, i.e., has an extension 711. In the present embodiment, the extension 711 extends along an entire area of the short edge 731-1 of the chamfered section 731 and continues to extend along the chamfered edge 731-2 of the chamfered section 731. The extension 711 may extend along the entire area of the chamfered edge 731-2 or may extend only along a partial area of the chamfered edge 731-2. The extension 711 may be linearly and not gradually varied, that is, have a constant width, or may be linearly and gradually varied, that is, have a variable width.

On the other side of the solar cell, the busbar 705 of another chamfered section 735 may also have an extension that may extend along the short edge of the another chamfered section 735. The extension extends all the way to the chamfer 722, or may extend only along a partial area of the right-angle short edge of the another chamfered section 735 without extending to the chamfer 722. Further preferably, the extension of the busbar 705 may extend along the entire short edge of the another chamfered section 735 and continue to extend along a partial or entire area of the chamfered edge of the another chamfered section 735.

Figure 17:
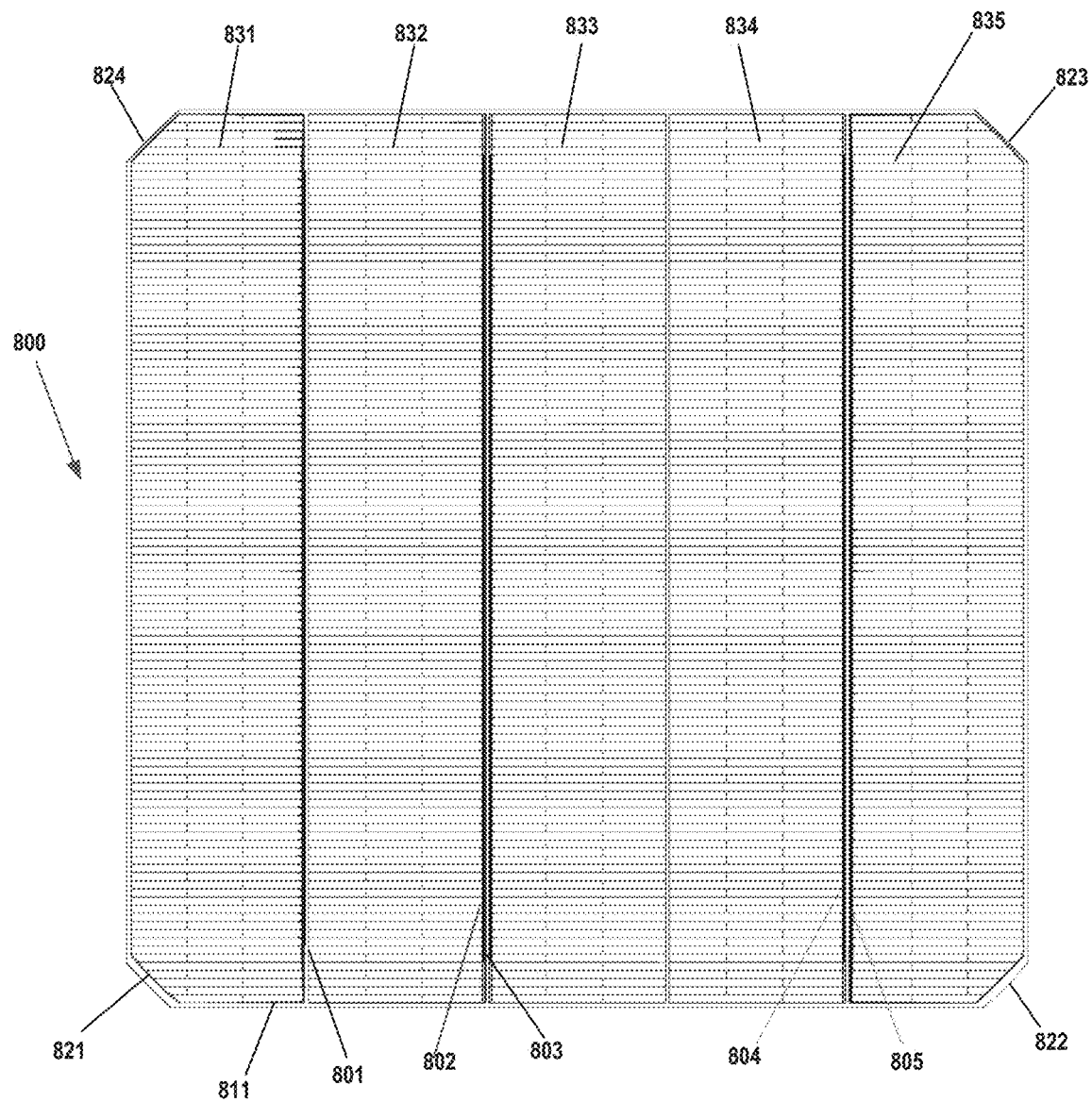
FIG. 17 and FIG. 18 show a front side and a back side of a solar cell according to a further preferred embodiment of the present disclosure in a top view and a bottom view, respectively.
Figure 18:
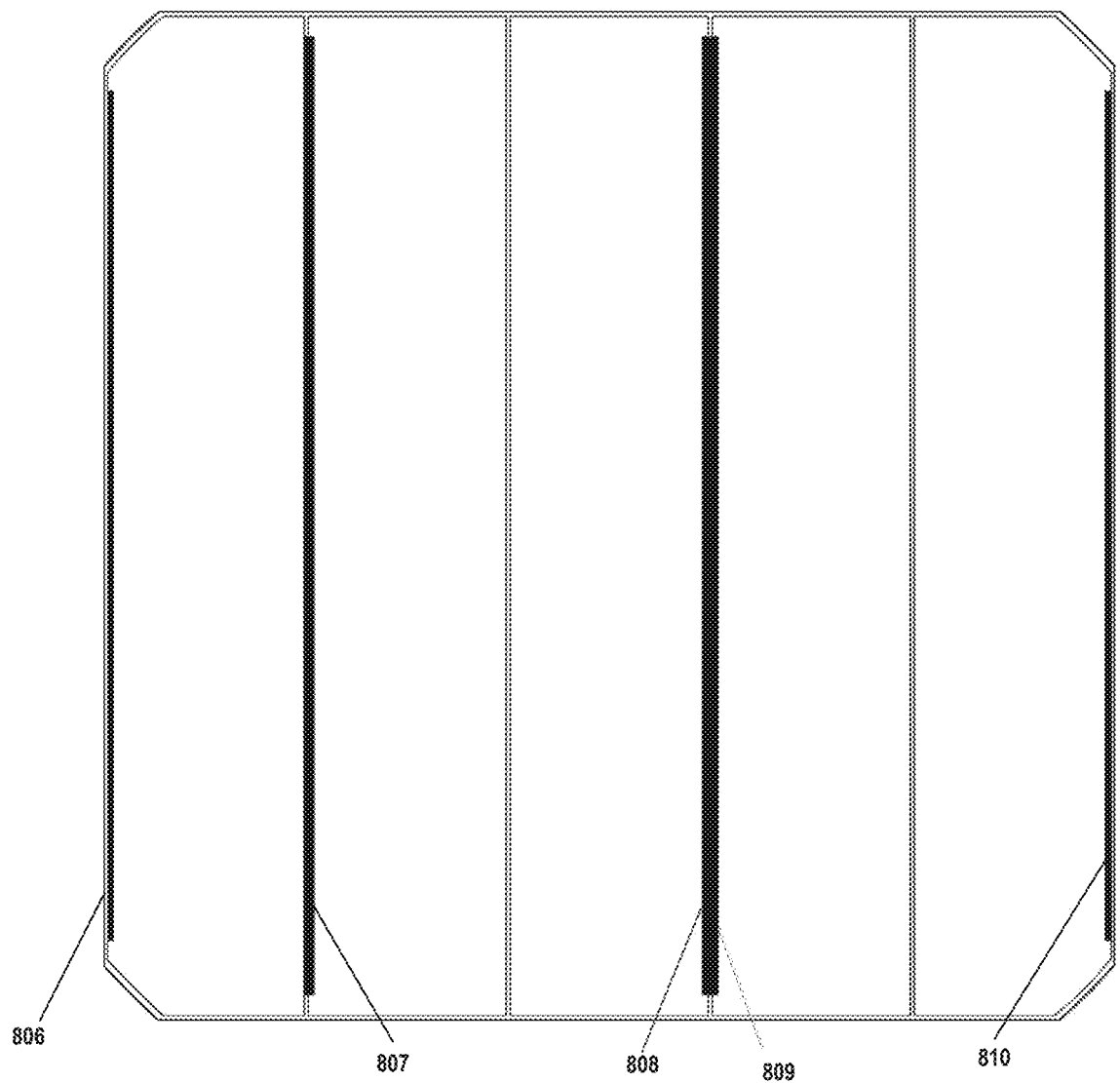

FIG. 17 and FIG. 18 show a front side and a back side of a solar cell 800 according to a preferred embodiment of the present disclosure in a top view and a bottom view, respectively. The illustrated solar cell 800 is formed by slicing a square rod chamfered at four edges, so that the solar cell has a substantially square shape with four corners chamfered as viewed from the front side and the back side. That is, the solar cell 800 has chamfers 821, 822, 823, and 824.

A plurality of mutually parallel front side busbars 801, 802, 803, 804, 805 parallel to two of the edges of the solar cell are disposed on the front side, and a plurality of mutually parallel back side busbars 806, 807, 808, 809, 810 parallel to the same two edges of the solar cell are disposed on the back side. The solar cell includes a plurality of juxtaposed sections 831, 832, 833, 834, 835, and each section includes one front side busbar and one back side busbar.

In the embodiment, the plurality of front side busbars 801, 802, 803, 804, 805 are distributed unevenly spaced apart on the front side. The plurality of front side busbars 801, 802, 803, 804, 805 include two pairs of front side busbars 802, 803 and 804, 805, two front side busbars of the two pairs of front side busbars are adjacent to each other, and a pair of front side busbars 804, 805 in the two pairs of front side busbars are close to an edge of the solar cell, and the other pair of front side busbars 802, 803 are not close to any edge of the solar cell.

The distribution of the plurality of back side busbars 806, 807, 808, 809, 810 corresponds to the distribution of the plurality of front side busbars 801, 802, 803, 804, 805 in such a manner that after the solar cell 400 is split into a plurality of solar cell strips with the above-mentioned sections, each of the solar cell strips has a front side busbar at a long edge on one side and a back side busbar at a long edge on the other side, and at least one solar cell strip has a front side busbar at the long edge on one side and a short edge intersecting therewith. As shown in FIG. 17 and FIG. 18, the solar cell 800 may be split into five solar cell strips. According to the sequence shown in FIGS. 17 and 18, from left to right, the first solar cell strip has a front side busbar 801 and a back side busbar 806, the second solar cell strip has a front side busbar 802 and a back side busbar 807, the third solar cell strip has a front side busbar 803 and a back side busbar 808, and the fourth solar cell strip has a front side busbar 804 and a back side busbar 809, and the fifth solar cell strip has a front side busbar 805 and a back side busbar 810. As described above, each of the first to fifth solar cell strips has a front side busbar at a long edge on one side and a back side busbar at the long edge on the other side, and at least one solar cell strip in the first to fifth solar cell strips has a front side busbar at the long edge on one side and a short edge intersecting therewith, that is, has a busbar at the long edge and has an extension of the busbar at a short edge intersecting with the long edge.

Specifically, the two outermost solar cell strips of the first to fifth solar cell strips, that is, the first solar cell strip and the fifth solar cell strip have chamfers. The first solar cell strip is also the left side chamfered section 831, and the fifth solar cell strip is also the right side chamfered section 835. The front side busbar 801 of the left side chamfered section 831 extends along the long edge on the side without chamfer, and after reaching the short edge intersecting (orthogonal in the present embodiment in the figure) the long edge, the front side busbar 801 continues to extend along the short edge, i.e., has an extension 811. The extension 811 extends towards the chamfer 821 along the short edge 831-1 of the chamfered section 831. The extension 811 may extend all the way to the chamfer 821 or may extend only along a partial area of the short edge 831-1 of the chamfered section 831 without extending to the chamfer 821. The extension 811 may be linearly and not gradually varied, that is, have a constant width, or may be linearly and gradually varied, that is, have a variable width.

By designing the extension of the front side busbar at the intersecting short edge or near the chamfer of the solar cell, it is possible to enhance the current collecting capability of the solar cell and increase the efficiency of the shingled solar cell module.

Similarly, the front side busbar 805 of the fifth solar cell strip, namely, of the right side chamfered section 835 extends along the long edge of the side without a chamfer, and after reaching the short edge intersecting (orthogonal in the embodiment in the figure) with the long edge, the front side busbar 805 continues to extend along the short edge, i.e., has an extension, the extension extends along the short edge of the right side chamfered section 835, the extension may extend all the way to the chamfer 822, or may extend only along a partial area of the short edge of another chamfered section 835 without extending to the chamfer 822.

Certainly, in the embodiment shown in the figures, the extension of the busbar is located on the lower short edge that intersects the long edge of the solar cell strip. As will be understood by those skilled in the art, the extension of the busbar may be disposed at the short edge on either side or at both the upper short edge and lower short edge which intersect with the long edge.

Figure 19:
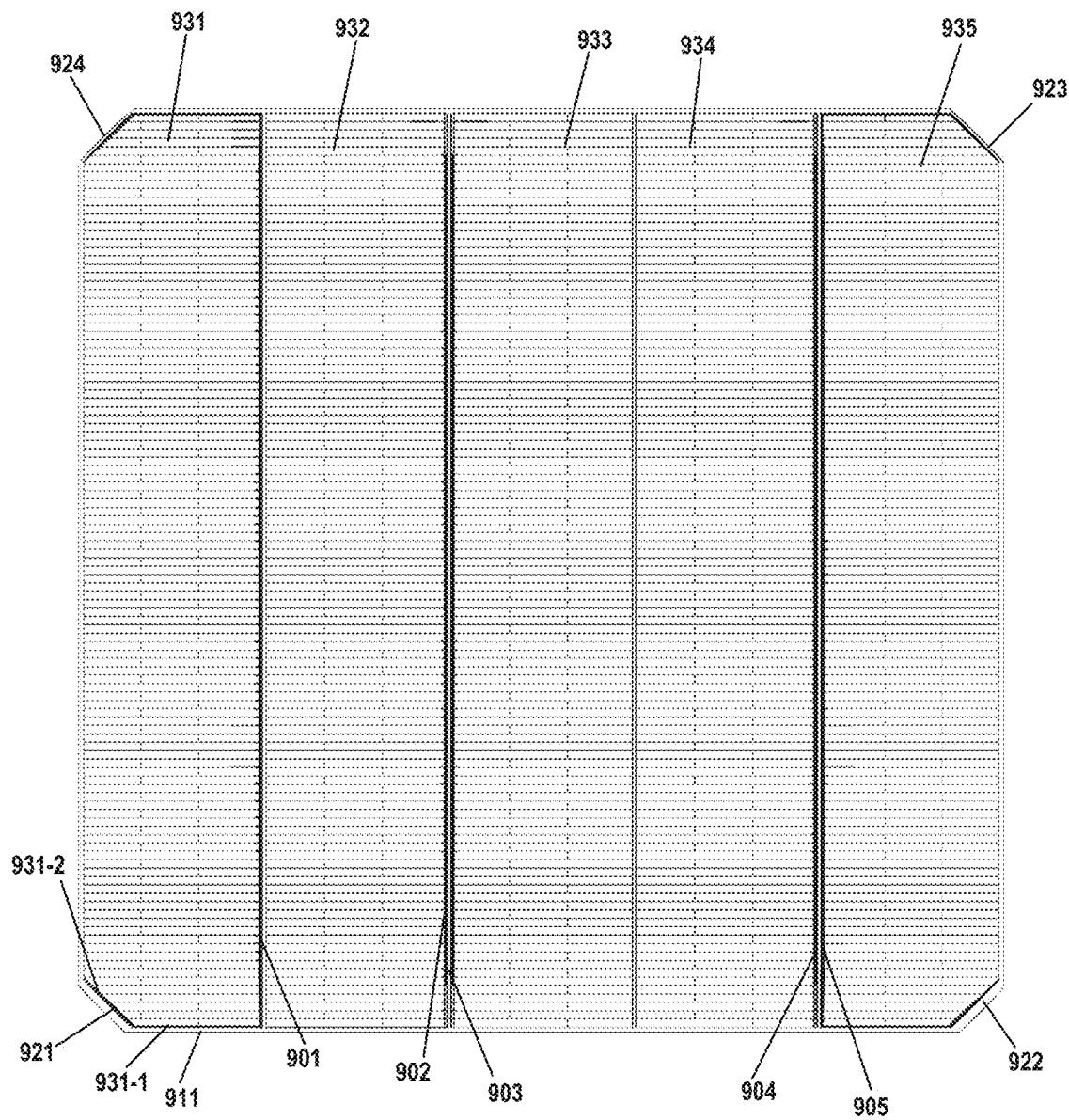
FIG. 19 and FIG. 20 show a front side and a back side of a solar cell according to a further preferred embodiment of the present disclosure in a top view and a bottom view, respectively.
Figure 20:
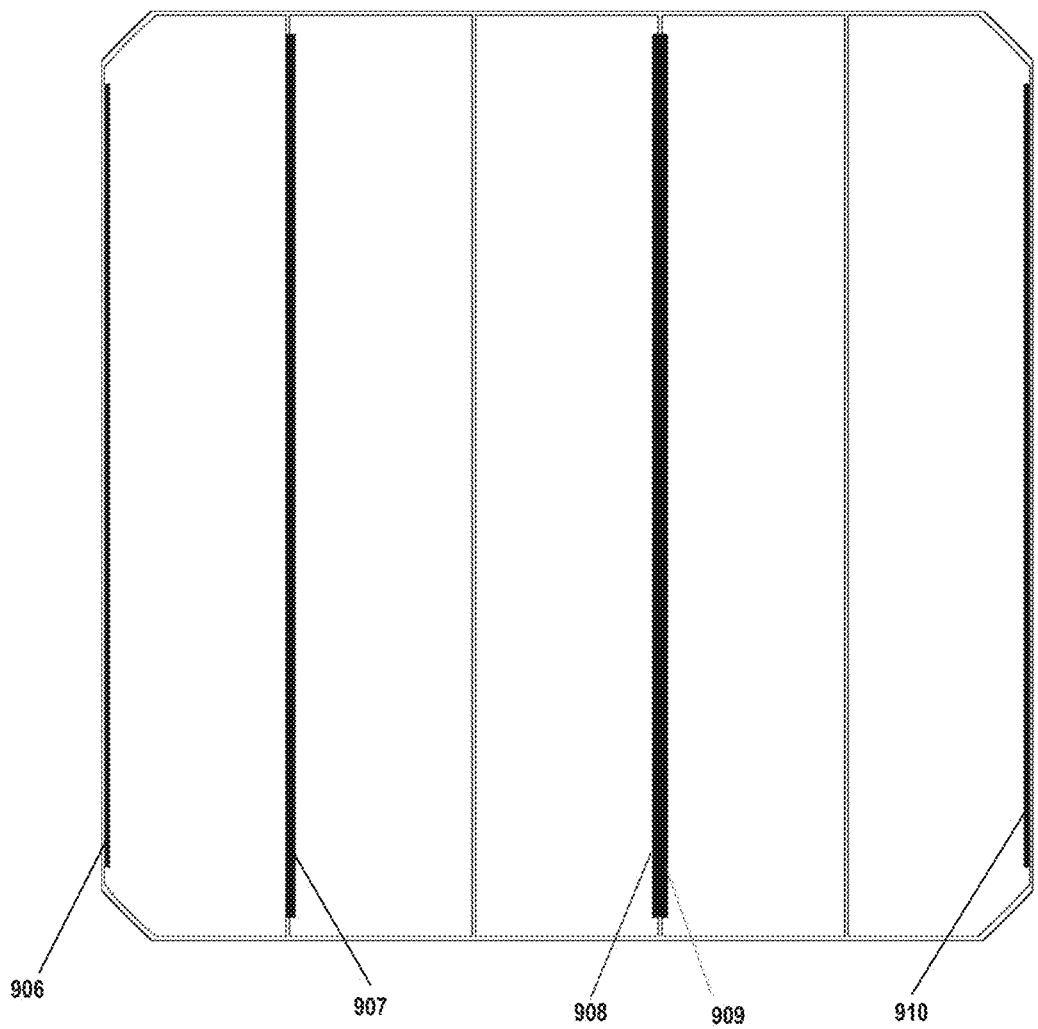

FIG. 19 and FIG. 20 show a front side and a back side of a solar cell 900 according to a preferred embodiment of the present disclosure in a top view and a bottom view, respectively. The illustrated solar cell 900 is formed by slicing a square bar chamfered at four edges, so that the solar cell has a substantially square shape with four corners chamfered as viewed from the front side and the back side. That is, the solar cell 900 has chamfers 921, 922, 923, and 924.

A plurality of mutually parallel front side busbars 901, 902, 903, 904, 905 parallel to two of the edges of the solar cell are disposed on the front side, and a plurality of mutually parallel back side busbars 906, 907, 908, 909, 910 parallel to the same two edges of the solar cell are disposed on the back side. The arrangement of the plurality of front side busbars and the plurality of back side busbars is the same as that of the embodiment shown in FIG. 19 and FIG. 20, and details are not described herein again.

The front side busbar 901 of the left side chamfered section 931 extends along the long edge on the side without chamfer, and after reaching the short edge intersecting the long edge, the front side busbar 901 continues to extend along the short edge, i.e., has an extension 911. The extension 911 extends along an entire area of the short edge 931-1 of the chamfered section 931 and continues to extend along the chamfered edge 931-2 of the chamfered section 931. The extension 911 may extend along the entire area of the chamfered edge 931-2 or may extend only along a partial area of the chamfered edge 931-2. The extension 911 may be linearly and not gradually varied, that is, have a constant width, or may be linearly and gradually varied, that is, have a variable width.

Similarly, the front side busbar 905 of the fifth solar cell strip, namely, of the right side chamfered section 923 extends along the long edge of the side without a chamfer, and after reaching the short edge intersecting with the long edge, the front side busbar 905 continues to extend along the short edge, i.e., has an extension, the extension extends along the short edge of another chamfered section 935, the extension may extend all the way to the chamfer 922, or may extend only along a partial area of the short edge of another chamfered section 935 without extending to the chamfer 922. Further preferably, the extension of the busbar 905 may extend along the entire short edge of the another chamfered section 923 and continue to extend along a partial or entire area of the chamfered edge of the another chamfered section 935.

Figure 21:
FIG. 21 shows a flow chart of a method for making a solar cell of a shingled solar cell module in accordance with the present disclosure.

FIG. 21 shows a flow chart of a method of making a solar cell for a shingled solar cell module in accordance with the present disclosure. The method includes the following steps:

a step of arranging back side busbars: arranging a plurality of back side busbars on the back side;

a step of arranging front side busbars: arranging a plurality of front side busbars on a front side of the solar cell, the plurality of front side busbars dividing the solar cell into a plurality of sections, the front side busbars being arranged as shown in FIG. 3 and FIG. 6, or being arranged as shown in FIG. 13 and FIG. 15, or being arranged as shown in FIG. 17 and FIG. 19; enabling a front side busbar of at least one section of the solar cell, for example a chamfered section having a chamfer, to have an extension at one end or both ends, the extension extending along an edge of said at least one section;

the distribution of the plurality of front side busbars corresponds to the distribution of the plurality of back side busbars, such that after the solar cell is split into a plurality of solar cell strips, one side of each solar cell strip is a front side busbar, and the other side is a back side busbar.

The extension of the front side busbar may extend along a partial or entire area of the short edge of the chamfered section. Further preferably, the extension may extend along the entire area of the short edge of the chamfered section and continue to extend along a partial or entire area of the chamfered edge of the chamfered section. The extension may be linearly and not gradually varied, or linearly and gradually varied.

By means of the method according to the disclosure, the solar cell has an extension of the busbar, in particular at the intersecting short edge or near the chamfer, which enhances the current collecting capability of the solar cell and increases the efficiency of the shingled solar cell module.

It may be appreciated by those skilled in the art that the above is only a specific description of the preferred embodiments of the inventive concept. According to the present disclosure, the arrangement of the front side and/or back side busbars of the solar cell may be uniform or non-uniform in the solar cell. After the solar cell is divided into solar cell strips, each of the solar cell strips has a front side busbar at a long edge on one side and a back side busbar at a long edge on the other side, and at least one solar cell strip in the solar cell strips has a busbar (front side busbar and/or back side busbar) at the long edge on one side and a short edge intersecting therewith, that is to say, has a busbar at the long edge and has an extension of the busbar at a short edge intersecting with the long edge.

The scope of the disclosure is defined only by the claims. Due to the teaching of the present disclosure, those skilled in the art will readily appreciate that alternative structures of the structures disclosed in the present disclosure may be considered as possible alternative embodiments, and the embodiments disclosed in the present disclosure may be combined to produce new embodiments, or the disclosure may be applied to other similar fields, and they also fall within the scope of the appended claims.

What is claimed is:

1. A solar cell for a shingled solar cell module, said solar cell having a front side and a back side, a plurality of front side busbars arranged on the front side, and a plurality of back side busbars arranged on the back side, comprising:
   a plurality of sections, each section comprising a front side busbar and a back side busbar located at edges thereof,
   wherein each front side busbar has a main body that extends along an edge of its respective section that is not an edge of the solar cell,
   wherein the solar cell has chamfers, and the front side busbar of at least one chamfered section of the solar cell has an extension at an end of its main body, the extension extending along an entire length of another edge of the chamfered section intersecting with the edge where the main body of the front side busbar of the section is located, and continues to extend along a partial or entire length of a chamfered edge of the chamfered section that abuts against the another edge wherein the front side busbar does not completely surround the at least one chamfered section.

2. The solar cell according to claim 1, wherein the extension extends linearly with a constant width or with a non-constant width.

3. The solar cell according to claim 1, wherein the plurality of front side busbars are distributed unevenly spaced apart on the front side.

4. The solar cell according to claim 3, wherein the plurality of front side busbars include two front side busbars which are adjacent to each other, and the two front side busbars are more distant from the edges of the solar cell with respect to all of the other front side busbars.

5. The solar cell according to claim 3, wherein the plurality of front side busbars include two pairs of front side busbars, and two front side busbars of each pair of the two pairs of front side busbars are adjacent to each other, and each pair of the two pairs of front side busbars is more close to one edge of the solar cell than all of the other front side busbars.

6. The solar cell according to claim 3, wherein the plurality of front side busbars include two front side busbars which are adjacent to each other, and the two front side busbars are more close to one edge of the solar cell than all of the other front side busbars.

7. The solar cell according to claim 3, wherein the plurality of front side busbars include two pairs of front side busbars, and two front side busbars of each pair of the two pairs of front side busbars are adjacent to each other, and one pair of the two pairs of front side busbars is more close to one edge of the solar cell than all of the other front side busbars, and the other pair of the two pairs of front side busbars is more distant from one opposite edge of the solar cell than at least one front side busbar.

8. The solar cell according to claim 1, wherein the solar cell is configured to split into a plurality of solar cell strips, the distribution of the plurality of back side busbars corresponds to the distribution of the plurality of front side busbars, the front side busbar is adjacent to a long edge at one side and an adjacent short edge of a corresponding solar cell strip, and the back side busbar is adjacent to a long edge at the other side of the corresponding solar cell strip.

9. A shingled solar cell module which is made from solar cell strips split from the solar cell according to claim 1.

10. A method of making a solar cell for a shingled solar cell module, the method comprising:
   arranging a plurality of front side busbars on a front side of the solar sell and a plurality of back side busbars on a back side of the solar cell, the plurality of front side busbars and backside busbars dividing the solar cell into a plurality of sections, each section comprising a front side busbar and a back side busbar located at edges thereof, each front side busbar having a main body that extends along an edge of its respective section that is not an edge of the solar cell,
   wherein the solar cell has chamfers, and the front side busbar of at least one chamfered section of the solar cell has an extension at an end of its main body, the extension extending along an entire length of another edge of the chamfered section intersecting with the edge of the section where the main body of the front side busbar of the section is located, and continues to extend along a partial or entire length of a chamfered edge of the chamfered section that abuts against the another edge wherein the front side busbar does not completely surround the at least one chamfered section.

11. The method according to claim 10, wherein the extension extends linearly with a constant width or with a non-constant width.

12. The method according to claim 10, wherein the plurality of front side busbars are distributed unevenly spaced apart on the front side.

13. The method according to claim 12, wherein the plurality of front side busbars include two front side busbars which are adjacent to each other, and the two front side busbars are more distant from the edges of the solar cell with respect to all of the other front side busbars.

14. The method according to claim 12, wherein the plurality of front side busbars include two pairs of front side busbars, and two front side busbars of each pair of the two pairs of front side busbars are adjacent to each other, and each pair of the two pairs of front side busbars is more close to one edge of the solar cell than all of the other front side busbars.

15. The method according to claim 12, wherein the plurality of front side busbars include two front side busbars which are adjacent to each other, and the two front side busbars are more close to the edge of the solar cell than all of the other front side busbars.

16. The method according to claim 12, wherein the plurality of front side busbars include two pairs of front side busbars, and two front side busbars of each pair of the two pairs of front side busbars are adjacent to each other, and one pair of the two pairs of front side busbars is more close to one edge of the solar cell than all of the other front side busbars, and the other pair of the two pairs of front side busbars is more distant from one opposite edge of the solar cell than at least one front side busbar.

* * * * *